(12) United States Patent
Cho et al.

(10) Patent No.: US 12,354,637 B2
(45) Date of Patent: Jul. 8, 2025

(54) MEMORY DEVICES AND METHODS THEREOF FOR MANAGING ROW HAMMER EVENTS THEREIN

(71) Applicant: Samsung Electronics Co., Ltd., Suwon-si (KR)

(72) Inventors: Sunghye Cho, Suwon-si (KR); Kijun Lee, Suwon-si (KR); Eunae Lee, Suwon-si (KR); Kyomin Sohn, Suwon-si (KR); Yeonggeol Song, Suwon-si (KR); Myungkyu Lee, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 93 days.

(21) Appl. No.: 18/341,128

(22) Filed: Jun. 26, 2023

(65) Prior Publication Data
US 2024/0096391 A1    Mar. 21, 2024

(30) Foreign Application Priority Data
Sep. 21, 2022  (KR) .................... 10-2022-0119545

(51) Int. Cl.
*G11C 11/00* (2006.01)
*G11C 11/406* (2006.01)

(52) U.S. Cl.
CPC .................................. *G11C 11/406* (2013.01)

(58) Field of Classification Search
CPC . G11C 11/406; G11C 11/408; G11C 11/4076; G11C 11/40; G11C 11/4078; G11C 11/4091; G11C 29/00; G11C 29/20; G11C 29/44; G11C 7/02; G11C 7/10; G11C 7/24; G11C 11/401; G11C 11/4063; G11C 11/4093; G11C 11/4096; G11C 7/00; G06F 3/06; G06F 12/02; G06F 12/08; G06F 13/14
See application file for complete search history.

(56) References Cited

U.S. PATENT DOCUMENTS

| | | |
|---|---|---|
| 9,685,240 B1 | 6/2017 | Park |
| 9,892,779 B2 | 2/2018 | Kang et al. |
| 10,262,717 B2 | 4/2019 | Fisch et al. |
| 10,600,470 B2 | 3/2020 | Bang |
| 10,734,058 B2 | 8/2020 | Shim et al. |
| 10,950,289 B2 | 3/2021 | Ito et al. |
| 11,087,821 B2 * | 8/2021 | Son .................. G11C 11/40611 |
| 11,158,364 B2 | 10/2021 | Penney et al. |
| 11,354,408 B2 | 6/2022 | Ghosh et al. |
| 11,631,448 B1 | 4/2023 | Lee et al. |
| 2022/0113868 A1 | 4/2022 | Cowles et al. |
| 2022/0199144 A1 | 6/2022 | Roberts |

FOREIGN PATENT DOCUMENTS

KR    20230068232 A    5/2023

* cited by examiner

*Primary Examiner* — Thong Q Le
(74) *Attorney, Agent, or Firm* — Myers Bigel, P.A.

(57) ABSTRACT

A memory device includes a memory cell array having a plurality of rows of memory cells therein, and a row hammer managing circuit, which is configured to detect a row hammer address based on a pre row hammer address, and each of a plurality of input row addresses associated with a plurality of accesses during a monitoring period for monitoring the plurality of accesses to a plurality of the rows of memory cells. A refresh control circuit is provided and is configured to perform a refresh operation on a memory cell row physically adjacent to a memory cell row corresponding to the row hammer address.

20 Claims, 14 Drawing Sheets

MEMORY DEVICES AND METHODS THEREOF FOR MANAGING ROW HAMMER EVENTS THEREIN

REFERENCE TO PRIORITY APPLICATION

This application claims priority under 35 U.S.C. § 119 to Korean Patent Application No. 10-2022-0119545, filed Sep. 21, 2022, in the Korean Intellectual Property Office, the disclosure of which is incorporated by reference herein in its entirety.

BACKGROUND

1. Field

The inventive concept relates to an electronic device, and more specifically, to an integrated circuit memory device for managing a row hammer address and an operating method thereof.

2. Description of Related Art

Systems using semiconductor chips widely use Dynamic Random Access Memory (DRAM) as an operating memory or a main memory of the systems. DRAM cell sizes are decreasing in order to increase DRAM capacity and density. Some DRAM-based systems may experience intermittent failures due to heavy workloads. These failures often can be traced by repeated accesses to a single row of memory cells, so-called row hammering. Repetitive access to a particular row may cause an increased rate of decay of adjacent rows (e.g., victim rows) due to parasitic electromagnetic coupling between the rows. Also, memory cells connected to victim rows may be disturbed, causing data corruption in which a bit value within a memory cell data is flipped.

To reduce row hammering, a DRAM may monitor row hammer addresses that are intensively accessed among access addresses for a certain period of time. The DRAM may store row hammer addresses in one or more registers and perform a refresh operation on a memory cell row physically adjacent to the memory cell rows corresponding to the row hammer addresses.

In general, DRAM uses registers (or latches) to control row hammer, and the number of row hammer addresses may be determined by the number of registers. However, the types of row hammers are diverse, and if the number of row hammer addresses increases according to the type of row hammer, the number of registers in DRAM must also increase. However, there is a manufacturing limit as to significantly increasing the number of registers, and increasing the number of registers adversely affects DRAM density.

Accordingly, there is a need for memory devices and operating methods that defend against various types of row hammer attacks without increasing the number of registers.

SUMMARY

The inventive concept provides a memory device and an operation method thereof for managing various types of row hammers and reducing the number of registers associated with row hammering.

According to an aspect of the inventive concept, there is provided a memory device having a memory cell array provided therein, which includes a plurality of memory cell rows. A row hammer managing circuit is provided, which is configured to detect a row hammer address based on: a pre row hammer address, and each of a plurality of input row addresses included in a plurality of accesses during a monitoring period for monitoring the plurality of accesses to the plurality of memory cell rows. The row hammer managing circuit is also configured to output the row hammer address in response to a refresh command, such as a refresh command provided by a host. A refresh control circuit is also provided, which is configured to perform a refresh operation on a memory cell row immediately physically adjacent to a memory cell row corresponding to the row hammer address.

According to another embodiment of the inventive concept, a method of operating a memory device is provided, which includes storing, in a second register, an input row address greater than a pre row hammer address among a plurality of input row addresses or a first minimum input row address among the plurality of input row addresses as a row hammer address, based on the plurality of input row addresses included in the plurality of accesses by a host and a pre row hammer address stored in a first register. A refresh operation is also performed on a memory cell row physically adjacent to a memory cell row corresponding to the row hammer address, in response to a refresh command provided by the host. In addition, a row hammer address may be stored as the pre row hammer address in the first register in response to the refresh command.

According to a further embodiment of the inventive concept, a memory device is provided, which includes a memory cell array therein. This memory cell array includes a plurality of memory cell rows. A row hammer managing circuit is provided, which is configured to: detect a row hammer address during a monitoring period for monitoring a plurality of accesses to the plurality of memory cell rows, and output the row hammer address in response to a refresh command provided from a host. A refresh control circuit is provided, which is configured to output a target row address to perform a refresh operation on a memory cell row physically adjacent to a memory cell row corresponding to the row hammer address. The row hammer managing circuit can include: a first register configured to store a pre row hammer address detected as the row hammer address in a monitoring period prior to the monitoring period, a first comparator configured to output a first comparison result signal indicating a result of comparing an input row address provided from the host with the pre row hammer address, a second register configured to store the input row address, a second comparator configured to output a second comparison result signal indicating a result of comparing the input row address with a row address stored in the second register, a flag generating circuit configured to output a flag signal based on the first comparison result signal and the second comparison result signal, and a register control circuit configured to control the second register to output the row address stored in the second register as the row hammer address based on the refresh command, the first comparison result signal, the second comparison result signal, and the flag signal.

According to a further embodiment of the inventive concept, there is provided a memory device having a memory cell array therein, which includes a plurality of memory cell rows. A row hammer managing circuit is provided, which includes a first register storing a pre row hammer address detected in a monitoring period for monitoring a plurality of accesses to the plurality of memory cell rows, and a second register sequentially storing one row address greater than the pre row hammer address for each subsequent monitoring period following the monitoring period. A refresh control circuit is provided, which is configured to output a target row address of a memory cell row physically adjacent to a memory cell row corresponding to the row address stored in the second register during a refresh operation.

According to another embodiment of the inventive concept, there is provided an electronic device including a host, which is configured to sequentially output input row addresses and periodically output a refresh command, and a memory device, which is configured to detect a row hammer address based on the input row addresses in a monitoring period and perform a refresh operation in response to the refresh command. The memory device includes a memory cell array having a plurality of memory cell rows therein. A row hammer managing circuit is provided, which is configured to: detect the row hammer address based on each of the input row addresses and a pre row hammer address detected before the monitoring period, and output the row hammer address in response to the refresh command. A refresh control circuit is provided, which is configured to perform a refresh operation on a memory cell row that is physically adjacent to a memory cell row corresponding to the row hammer address.

According to a further embodiment of the inventive concept, a memory device is provided with: a memory cell array having a plurality of rows of memory cells therein, row hammer managing circuit configured to detect a row hammer address associated with a row of memory cells within the plurality thereof, in response to a plurality of word line accesses to the memory cell array during a monitoring time period; and a refresh control circuit configured to perform a refresh operation on at least one row of memory cells extending immediately adjacent the row of memory cells associated with the row hammer address, in response to the detection of the row hammer address by the row hammer managing circuit.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

Hereinafter, embodiments of the present disclosure will be described in detail with reference to the accompanying drawings.

Figure 1:
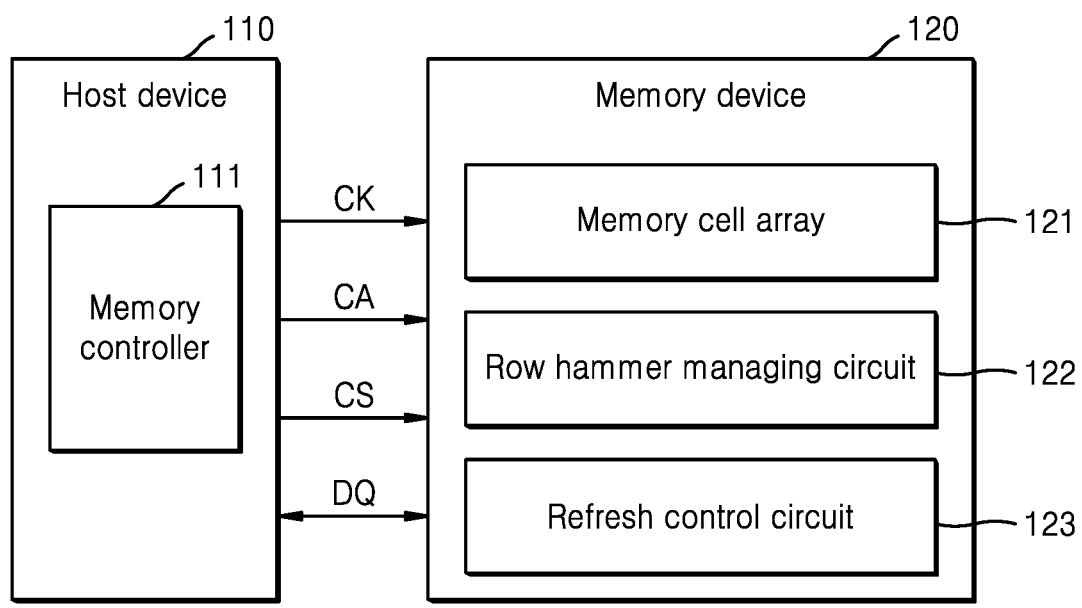
FIG. 1 is a diagram for describing an electronic device according to embodiments of the present disclosure.

FIG. 1 is a diagram for describing an electronic device according to embodiments of the present disclosure.

Referring to FIG. 1, an electronic device 100 may be, for example, a computing system, such as a computer, a notebook computer, a server, a workstation, a portable communication terminal, a personal digital assistant (PDA), a portable multimedia player (PMP), a smart phone, or a wearable device. The electronic device 100 may include a host device 110 and a memory device 120.

The host device 110 may be a part of components included in a computing system, such as a graphics card. The host device 110 may be communicatively connected to the memory device 120 through a memory bus.

As a functional block for performing general computer operations in the electronic device 100, the host device 110 may correspond to a central processing unit (CPU), a digital signal processor (DSP), a graphics processing unit (GPU), or an application processor (AP). The host device 110 may include a memory controller 111 that controls data transmission/reception to or from the memory device 120. The host device 110 may be referred to as a host.

In some embodiments, the memory controller 111 may provide accesses to the memory device 120 through a memory bus. In one embodiment, access may include an active command and a row address. However, the inventive concept is not limited thereto, and the access may further include a write command or a read command, a column address, and a pre-charge command, for example.

In one embodiment, the memory controller 111 may sequentially output accesses. When access includes an active command and a row address, the memory controller 111 may sequentially output a plurality of active commands and a plurality of row addresses. In some embodiments, the memory controller 111 may periodically output a refresh command. The refresh command may be a command instructing the memory device 120 to perform a refresh operation.

The memory controller 111 may access the memory device 120 according to a memory request from the host device 110. The memory controller 111 may include a memory physical layer interface (memory PHY) for interfacing with the memory device 120, such as selecting rows and columns corresponding to memory locations, and writing data to or reading data from memory locations. The memory PHY may include a physical or electrical layer and a logical layer provided for signals, frequency, timing, driving, detailed operating parameters, and functionality required for efficient communication between the memory controller 111 and the memory device 120. The memory PHY may support features of the double data rate (DDR) and/or low-power DDR (LPDDR) protocol of the Joint Electron Device Engineering Council (JEDEC) standard.

The memory controller 111 and the memory device 120 may be connected to one another through a memory bus. Although it is shown in FIG. 1 that a clock signal CK, a command/address CA, a chip select signal CS, and data DQ are each provided through one signal line in FIG. 1, in practice, each of the clock signal CK, command/address CA, chip select signal CS, and data DQ may be provided through a plurality of signal lines or buses. Signal lines between the memory controller 111 and the memory device 120 may be connected through connectors. Connectors may be implemented as pins, balls, signal lines, or other hardware components, for example.

The clock signal CK may be transmitted from the memory controller 111 to the memory device 120 through a clock signal line of a memory bus. The command/address CA may be transmitted from the memory controller 111 to the memory device 120 through a command/address signal line of a memory bus. The chip select signal CS may be transmitted from the memory controller 111 to the memory device 120 through a chip select line of a memory bus. For example, a signal transmitted through a command/address signal line when the chip select signal CS is activated to a logic high level may be a command. Data DQ may be transmitted from the memory controller 111 to the memory device 120 or from the memory device 120 to the memory controller 111 through a data bus composed of bidirectional signal lines of a memory bus.

The memory device 120 may write data DQ or read data DQ and perform a refresh operation under control by the memory controller 111. For example, the memory device 120 may be a double data rate synchronous dynamic random access memory (DDR SDRAM) device. However, the scope of the inventive concept is not limited thereto, and the memory device 120 may be any one of volatile memory devices, such as LPDDR SDRAM, wide Input/Output (I/O) DRAM, high bandwidth memory (HBM), hybrid memory cube (HMC), and the like.

In some embodiments, the memory device 120 may detect a row hammer address based on active commands and row addresses provided from the memory controller 111 in the monitoring period. In one embodiment, the monitoring period may be a refresh rate time interval tREFi, as described below with reference to FIG. 4. In another embodiment, the monitoring period may be a period between two refresh operation periods ROP, as described below with reference to FIGS. 5B and 5C. The memory device 120 may perform a refresh operation based on a row hammer address detected in response to a refresh command provided from the memory controller 111. A row address provided to the memory device 120 from the memory controller 111 may be referred to as an input row address.

The memory device 120 may include a memory cell array 121, a row hammer managing circuit 122, and a refresh control circuit 123. The memory cell array 121 may include a plurality of word lines, a plurality of bit lines, and a plurality of memory cells. A plurality of memory cells may be formed at points where word lines intersect with bit lines. A memory cell of the memory cell array 121 may be a volatile memory cell, for example, a DRAM cell.

The row hammer managing circuit 122 may count the number of access times during the monitoring period. The row hammer managing circuit 122 may detect a row hammer address based on a pre row hammer address and each of a plurality of input row addresses. The input row address may be a row address provided from the memory controller 111. The pre row hammer address may be a row address detected as a row hammer address in a monitoring period prior to the current monitoring period. The pre row hammer address may be stored in the row hammer managing circuit 122.

In one embodiment, the row hammer managing circuit 122 may output a row hammer address to the refresh control circuit 123 in response to a refresh command.

In another embodiment, the row hammer managing circuit 122 may provide a row hammer address to the memory controller 111 through a data bus. The row hammer managing circuit 122 may output the target row address to the refresh control circuit 123 in response to the refresh command received from the memory controller 111 and at least one target row address. The target row address may be row addresses of memory cells physically adjacent to memory cells associated with the row hammer addresses.

The refresh control circuit 123 may perform a refresh operation on a memory cell row physically adjacent to the memory cell row corresponding to the row hammer address. In an embodiment, the refresh control circuit 123 may acquire a target row address based on the row hammer address provided from the row hammer managing circuit 122 and provide the target row address to the memory cell array 121.

Figure 2:
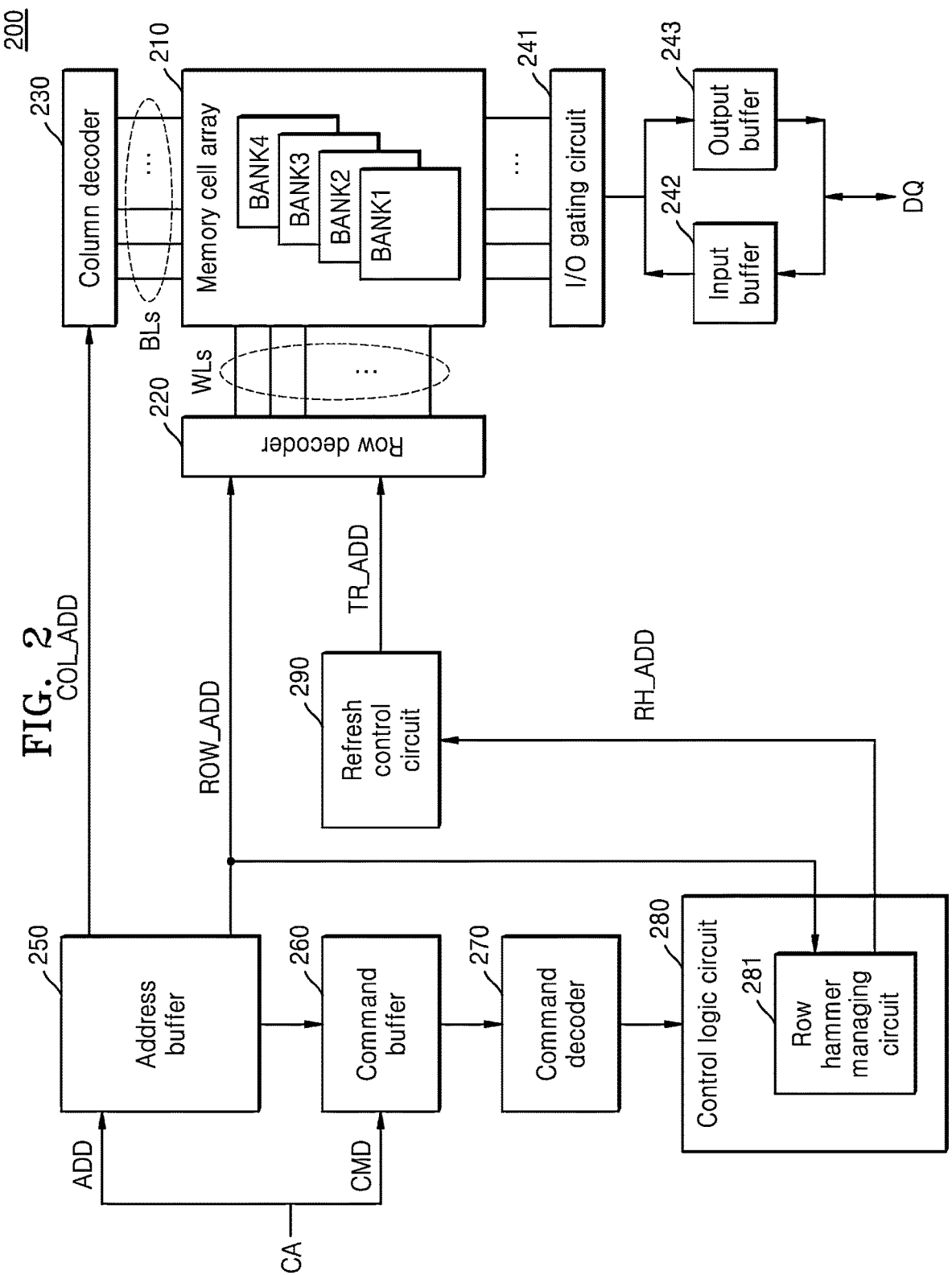
FIG. 2 is a diagram for describing a memory device according to example embodiments of the present disclosure.

FIG. 2 is a diagram for describing a memory device according to example embodiments of the present disclosure. A memory device 200 shown in FIG. 2 may correspond to the memory device 120 shown in FIG. 1. The configuration of the memory device 200 shown in FIG. 2 may be provided as an example. Referring to FIG. 2, the memory device 200 may include a memory cell array 210, a row decoder 220, a column decoder 230, an input/output gating circuit 241, an input buffer 242, an output buffer 243, an address buffer 250, a command buffer 260, a command decoder 270, a control logic circuit 280, and a refresh control circuit 290. Although not shown in FIG. 2, the memory device 200 may further include a clock buffer, a mode register set (MRS), a bank control logic, a voltage generating circuit, and the like.

The memory cell array 210 may include a plurality of memory cells provided in a matrix form arranged in rows and columns. The memory cell array 210 may include a plurality of word lines WLs and a plurality of bit lines BLs connected to a plurality of memory cells. A plurality of word lines WLs may be connected to rows of a plurality of memory cells. A row of memory cells may be memory cells connected to a certain word line. A plurality of bit lines BLs may be connected to columns of a plurality of memory cells. A column of memory cells may be memory cells connected to a certain bit line. Data of memory cells connected to an active word line may be sensed and amplified by sense amplifiers connected to a plurality of bit lines BLs.

In some embodiments, the memory cell array 210 may include a plurality of banks. For example, the memory cell array 210 may include first to fourth banks BANK1 to BANK4. The bank control logic may generate bank control signals in response to the bank address. Also, the row decoder 220 and the column decoder 230 of the bank corresponding to the bank address among the first to fourth banks BANK1 to BANK4 may be activated in response to the bank control signals. A memory device 200 including four banks is illustrated in FIG. 2, but is not limited thereto, and according to embodiments, the memory device 200 may include any number of banks.

The row decoder 220 and the column decoder 230 may be disposed to correspond to each of the first to fourth banks BANK1 to BANK4, and the row decoder 220 and the column decoder 230 connected to the bank corresponding to the bank address may be activated. The row decoder 220 may decode the input row address ROW_ADD received from the address buffer 250 and select a word line corresponding to the input row address ROW_ADD from among a plurality of word lines WLs. In some embodiments, the row decoder 220 may include a word line driver that activates a selected word line.

The column decoder 230 may select predetermined bit lines from among a plurality of bit lines BLs of the memory cell array 210. The column decoder 230 may generate a column select signal by decoding a burst address that is gradually increased by +1 based on the column address COL_ADD in a burst mode, and connect bit lines selected by the column select signal to the I/O gating circuit 241. The burst address may be addresses of column locations accessible in relation to the burst length BL for a read command and/or a write command.

The I/O gating circuit 241 may include read data latches for storing read data of bit lines selected by a column select signal, and a write driver for writing write data into the memory cell array 210. The input buffer 242 and the output buffer 243 may be included. Read data stored in the I/O gating circuit 241 (e.g., read data latches) may be provided to the data bus through the output buffer 243. Write data may be stored in the memory cell array 210 through the input buffer 242 connected to the data bus and the I/O gating circuit 241 (e.g., a write driver).

The address buffer 250 may receive the address ADD included in the command/address CA from the memory controller 111. The address ADD may include a bank address, an input row address ROW_ADD, and a column address COL_ADD. The address buffer 250 may provide a bank address to the bank control logic, provide an input row address ROW_ADD to the row decoder 220, and provide a column address COL_ADD to the column decoder 230.

The command buffer 260 may receive the command CMD included in the command/address CA. The command buffer 260 may provide the command CMD to the command decoder 270. The command decoder 270 may decode the command CMD and provide a corresponding command, for example, an active command, a write command, a read command, a pre-charge command, a refresh command, and the like, to the control logic circuit 280.

The control logic circuit 280 may receive the clock signal CK and the command CMD and generate control signals for controlling an operation timing of the memory device 200 and/or a memory operation. The control logic circuit 280 may provide control signals to circuits of the memory device 200 to operate as set in the operation and control parameters stored by the MRS. The control logic circuit 280 may read data from the memory cell array 210 and write data to the memory cell array 210 using control signals. Although the address buffer 250, the command buffer 260, the command decoder 270, and the control logic circuit 280 are shown in FIG. 2 as separate components, the address buffer 250, the command buffer 260, the command decoder 270, and the control logic circuit 280 may be implemented as a single element. In addition, although the command CMD and the address ADD are provided as separate signals in FIG. 2, the address may also be included in the command as presented in the LPDDR standard or the like.

The control logic circuit 280 may count the number of times accessing each of the memory cell rows in the memory cell array 210. Also, the control logic circuit 280 may initialize the counted number of access times in response to the refresh command.

In some embodiments, the control logic circuit 280 may include a row hammer managing circuit 281. Although the row hammer managing circuit 281 is shown in FIG. 2 as being included in the control logic circuit 280, the inventive concept is not limited thereto, and the row hammer managing circuit 281 may be disposed outside the control logic circuit 280 as a separate configuration from the control logic circuit 280. The row hammer managing circuit 281 may be implemented in hardware, firmware, software, or a combination thereof for controlling and/or managing row hammers.

The row hammer managing circuit 281 may detect a row hammer address RH_ADD during a monitoring period for monitoring accesses to a plurality of memory cell rows. In some embodiments, when the access includes the input row address ROW_ADD, the row hammer managing circuit 281 may detect the row hammer address RH_ADD based on the input row address ROW_ADD. In an embodiment, the row hammer managing circuit 281 may detect a row hammer address RH_ADD based on a pre row hammer address and each of a plurality of input row addresses during the monitoring period.

In some embodiments, the row hammer managing circuit 281 may transmit the detected row hammer address RH_ADD to the memory controller 111. In one embodiment, the memory controller 111 may issue a refresh command in response to a row hammer address RH_ADD. In another embodiment, the memory controller 111 transmits an address (e.g., at least one target row address TR_ADD) of a memory cell row physically adjacent to a memory cell row having a row hammer address RH_ADD among a plurality of memory cell rows to the memory device 200 together with the refresh command in response to the row hammer address RH_ADD.

The row hammer managing circuit 281 may provide the row hammer address RH_ADD to the refresh control circuit 290 in response to a refresh command. In an embodiment, the row hammer managing circuit 281 may transfer at least one target row address TR_ADD provided from the memory controller 111 to the refresh control circuit 290.

The refresh control circuit 290 may perform a refresh operation on a memory cell row physically adjacent to the memory cell row corresponding to the row hammer address RH_ADD. In an embodiment, the refresh control circuit 290 may provide the row decoder 220 with at least one target row address TR_ADD transmitted from the row hammer managing circuit 281 to perform a refresh operation. In another embodiment, the refresh control circuit 290 may obtain at least one target row address TR_ADD based on the row hammer address RH_ADD transmitted from the row hammer managing circuit 281, and provide at least one target row address TR_ADD to the row decoder 220. During a refresh operation, a memory cell row having a target row address TR_ADD may be refreshed.

The control logic circuit 280 may control the refresh control circuit 290 so that the refresh control circuit 290 performs a normal refresh operation on a plurality of memory cell rows in response to a refresh command. The normal refresh operation may be an operation of sequentially refreshing a plurality of memory cell rows by increasing a refresh counter value by +1. The control logic circuit 280 may also control the refresh control circuit 290 to perform a target row refresh operation in response to a refresh command. The target row refresh operation may be an operation of refreshing a certain memory cell row subjected to a row hammer attack. In an embodiment, the refresh control circuit 290 may sequentially perform a normal refresh operation and a target row refresh operation.

Figure 3:
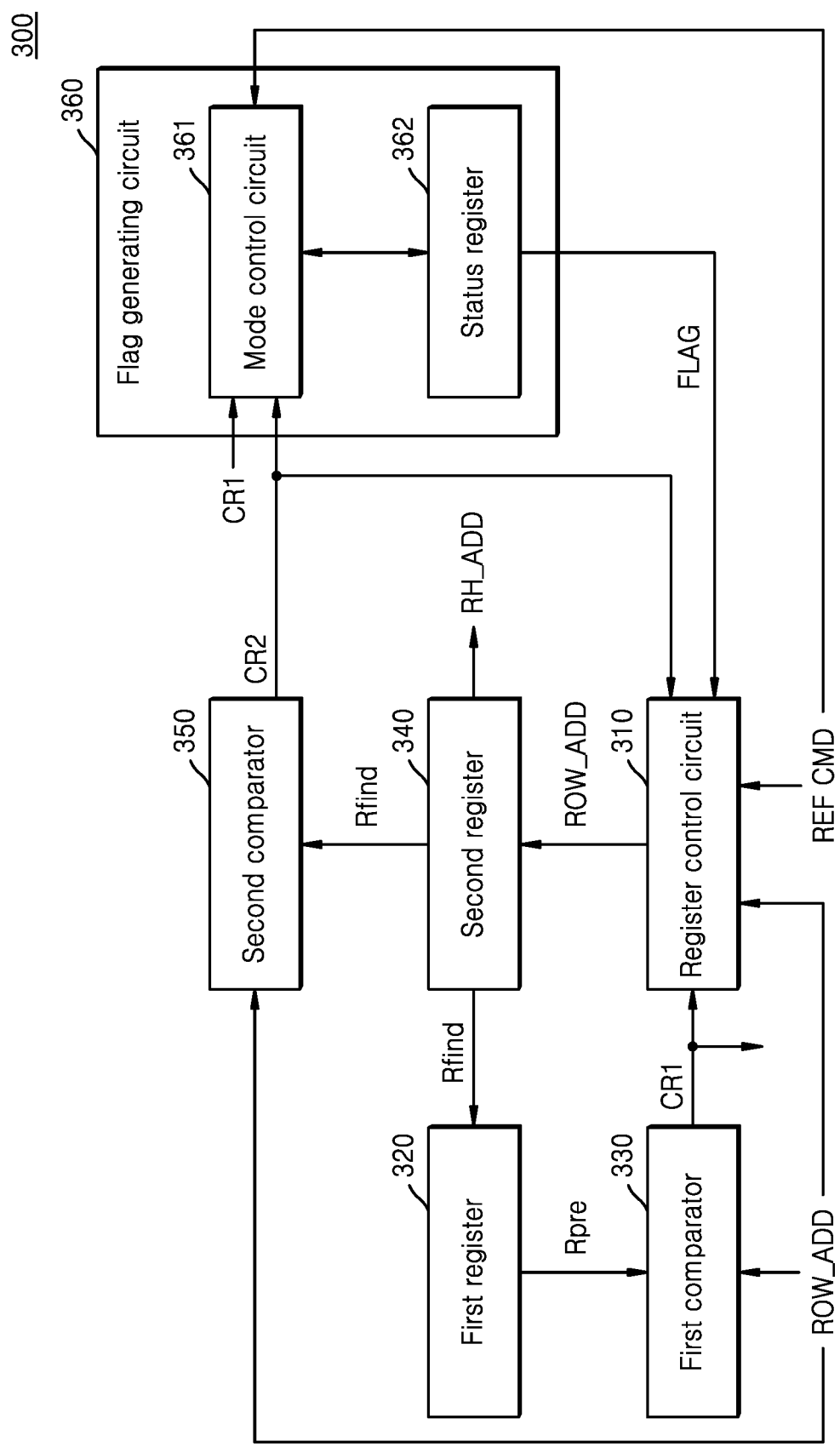
FIG. 3 is a diagram for explaining a row hammer managing circuit according to embodiments of the present disclosure.

FIG. 3 is a diagram for explaining a row hammer managing circuit according to embodiments of the present disclosure. Referring to FIG. 3, the row hammer managing circuit 300 may include a register control circuit 310, a first register 320, a first comparator 330, a second register 340, a second comparator 350, and a flag generating circuit 360. The register control circuit 310 may control the second register 340, in response to the refresh command REF CMD, the first comparison result signal CR1, the second comparison result signal CR2, and the flag signal FLAG.

According to an embodiment, the register control circuit 310 may provide an input row address ROW_ADD to the second register 340 and the second register 340 may store the input row address ROW_ADD. When a first input row address is input for the first time in a monitoring period, the flag signal FLAG may have a first bit value. For example, the first bit value may be "0" and the second bit value may be "1", but the inventive concept is not limited thereto. Hereinafter, it is assumed that the first bit value of the flag signal FLAG is "0" and the second bit value is "1". The foregoing embodiment will be described later with reference to FIG. 7.

In some embodiments, when the first input row address is less than or equal to a pre row hammer address Rpre, the flag signal FLAG may be generated to have a first bit value. When the first input row address ROW_ADD1 is greater than the pre row hammer address Rpre, the flag signal FLAG may be generated to have a second bit value. A pre row hammer address Rpre may refer to a row address on which a refresh operation has been performed. In some embodiments, the flag signal FLAG has a first bit value, and in the monitoring period, the input row address ROW_ADD input after the first input row address may be greater than the pre row hammer address Rpre. In this case, the register control circuit 310 may provide the input row address ROW_ADD to the second register 340 so that the second register 340 stores the input row address ROW_ADD. Also, a bit value of the flag signal FLAG may be changed from a first bit value to a second bit value. When one row address is greater than another row address, the address value of the one row address is relatively larger than that of the other row address or the number of the one row address is relatively greater than that of the other row address. Here, a plurality of row addresses are sequentially arranged in the memory cell array. For example, a second row address having a greater address value than a first row address may mean that the second row address that is next in sequence in terms of addressing has a greater address value than that of the first row address. The foregoing embodiment will be described later with reference to FIG. 8.

In some embodiments, the flag signal FLAG may have a first bit value, and the input row address ROW_ADD input after the first input row address may be less than or equal to the pre row hammer address Rpre, and the input row address ROW_ADD may be less than or equal to the row address Rfind stored in the second register 340. In this case, the register control circuit 310 may provide the input row address ROW_ADD to the second register 340 so that the second register 340 stores the input row address ROW_ADD. Also, the flag signal FLAG may maintain the first bit value. The foregoing embodiment will be described later with reference to FIG. 8.

In some embodiments, the flag signal FLAG may have a first bit value, and the input row address ROW_ADD input after the first input row address may be less than or equal to the pre row hammer address Rpre, and the input row address ROW_ADD may be greater than the row address Rfind stored in the second register 340. In this case, the register control circuit 310 may wait without storing the input row address ROW_ADD in the second register 340. Also, the flag signal FLAG may maintain the first bit value. The foregoing embodiment will be described later with reference to FIG. 8.

In some embodiments, the flag signal FLAG may have a second bit value, and the input row address ROW_ADD input after the first input row address may be greater than the pre row hammer address Rpre, and may be less than the row address Rfind stored in the second register 340. In this case, the register control circuit 310 may provide the input row address ROW_ADD to the second register 340 so that the second register 340 stores the input row address ROW_ADD. Also, the flag signal FLAG may maintain the second bit value. The foregoing embodiment will be described later with reference to FIG. 9.

In some embodiments, the register control circuit 310 may control the second register 340 so that the second register 340 provides the row address Rfind to the first register 320 in response to the refresh command REF CMD. The register control circuit 310 may control the second register 340 so that the second register 340 provides the row address Rfind to the refresh control circuit 290 as the row hammer address RH_ADD in response to the refresh command REF CMD. At this time, the flag signal FLAG may have an initial value. The initial value may be, for example, a first bit value. However, the inventive concept is not limited thereto.

The first register 320 may store a pre row hammer address Rpre. The pre row hammer address Rpre may be a row address that has been detected as a row hammer address in a monitoring period prior to the monitoring period. The first register 320 may provide the pre row hammer address Rpre to the first comparator 330. In some embodiments, the first register 320 may store the row address Rfind output from the second register 340 as a pre row hammer address Rpre. In this specification, the row address stored in the first register 320 may be referred to as a pre row hammer address Rpre.

The first comparator 330 may compare the input row address ROW_ADD provided from the memory controller 111 to the pre row hammer address Rpre, and output a first comparison result signal CR1. The first comparison result signal CR1 may indicate a comparison result between the input row address ROW_ADD and the pre row hammer address Rpre. For example, when the input row address ROW_ADD is less than or equal to the pre row hammer address Rpre, the first comparison result signal CR1 may have a first value. In another example, when the input row address ROW_ADD is greater than the pre row hammer address Rpre, the first comparison result signal CR1 may have a second value that is different from the first value. In one embodiment, the first value and the second value may be expressed as bit values, but are not limited thereto. The first comparison result signal CR1 may be provided to the register control circuit 310 and the flag generating circuit 360. The first comparator 330 may be implemented as a digital comparator, but is not limited thereto.

The second register 340 may store the input row address ROW_ADD under control by the register control circuit 310. The second register 340 may provide the stored row address Rfind to the second comparator 350. The second register 340 may output the stored row address Rfind under control by the register control circuit 310. The output row address Rfind may be provided to the first register 320 and may be provided to the refresh control circuit 290 as the row hammer address RH_ADD. In some embodiments, during the monitoring period, the input row address ROW_ADD may be stored in the second register 340 as a candidate for the row hammer address RH_ADD. Then, when a refresh operation according to the refresh command REF CMD is performed, the row address Rfind previously stored as a row hammer address RH_ADD candidate in the second register 340 may be output as the row hammer address RH_ADD.

In some embodiments, the input row address ROW_ADD detected as the row hammer address RH_ADD may be greater than the pre row hammer address Rpre. Also, the number of input row addresses ROW_ADD detected as row hammer addresses RH_ADD during a certain monitoring period may be one. Accordingly, one row hammer address RH_ADD greater than the pre row hammer address Rpre may be detected one-by-one for each monitoring period. In some embodiments, the input row address ROW_ADD detected as the row hammer address RH_ADD greater than the pre row hammer address Rpre may be sequentially stored in the second register 340. Here, the sequentially stored order may be an ascending order, and in this case, the ascending order may refer to the fact that the number of row addresses gradually increases. However, the inventive concept is not limited to only this storage order.

The second comparator 350 may compare the input row address ROW_ADD with the row address Rfind stored in the second register 340 and output a second comparison result signal CR2. The second comparison result signal CR2 may indicate a comparison result between the input row address ROW_ADD and the row address Rfind. For example, when the input row address ROW_ADD is less than the row address Rfind, the second comparison result signal CR2 may have a third value. In another example, if the input row address ROW_ADD is greater than or equal to the row address Rfind, the second comparison result signal CR2 may have a fourth value that is different from the third value. In one embodiment, the third value and the fourth value may be expressed as bit values, but are not limited thereto. The second comparison result signal CR2 may be provided to the register control circuit 310 and the flag generating circuit 360. The second comparator 350 may be implemented as a digital comparator, but is not limited thereto.

The flag generating circuit 360 may output a flag signal FLAG based on the first comparison result signal CR1 and the second comparison result signal CR2. In some embodiments, when the input row address ROW_ADD is less than or equal to the pre row hammer address Rpre, the flag generating circuit 360 may output a flag signal FLAG having a first bit value. In some embodiments, during a state where the flag signal FLAG has a first bit value, when the input row address ROW_ADD is greater than the pre row hammer address Rpre, the flag generating circuit 360 may output a flag signal FLAG having a second bit value.

In some embodiments, the flag generating circuit 360 may initialize the flag signal FLAG in response to the refresh command REF CMD. At this time, the flag signal FLAG may have an initial value, and the initial value may be, for example, a first bit value. The flag signal FLAG, having a first bit value or a second bit value, may be a signal instructing execution of one of the first mode and the second mode. In one embodiment, when the flag signal FLAG has a first bit value, the row hammer managing circuit 300 may execute the first mode. The first mode may be a mode for detecting a first minimum input row address among the plurality of input row addresses ROW_ADD. In another embodiment, when the flag signal FLAG has a second bit value, the row hammer managing circuit 300 may execute the second mode. The second mode may be a mode for detecting a second minimum input row address among the plurality of input row addresses ROW_ADD greater than the pre row hammer address Rpre.

The flag generating circuit 360 may include a mode control circuit 361 and a status register 362. The mode control circuit 361 may control the status register 362 based on the first comparison result signal CR1, the second comparison result signal CR2, and the refresh command REF CMD.

In some embodiments, the mode control circuit 361 may control the status register 362 to output the flag signal FLAG having an initial value in response to the refresh command REF CMD. The initial value may be, for example, a first bit value. In some embodiments, with the flag signal FLAG having an initial value, when the first comparison result signal CR1 has a first value, the mode control circuit 361 may control the status register 362 to output a flag signal FLAG having a first bit value. In some embodiments, with the flag signal FLAG having an initial value, when the first comparison result signal CR1 has the second value, the mode control circuit 361 may control the status register 362 to output the flag signal FLAG having the second bit value. In some embodiments, in a state where the flag signal FLAG has a first bit value, the first comparison result signal CR1 has a first value, and when the second comparison result signal CR2 has the third value, the mode control circuit 361 may control the status register 362 to output the flag signal FLAG having the first bit value.

As described above, the row hammer managing circuit 300 includes a register for storing an address that has been detected as a row hammer address and a register for storing an address to be detected as a row hammer address, and it has the advantage of efficiently controlling row hammer while reducing the number of registers. Moreover, because the number of registers included in the row hammer managing circuit 300 is reduced, there is an effect of improving the degree of integration of the memory device.

Figure 4:
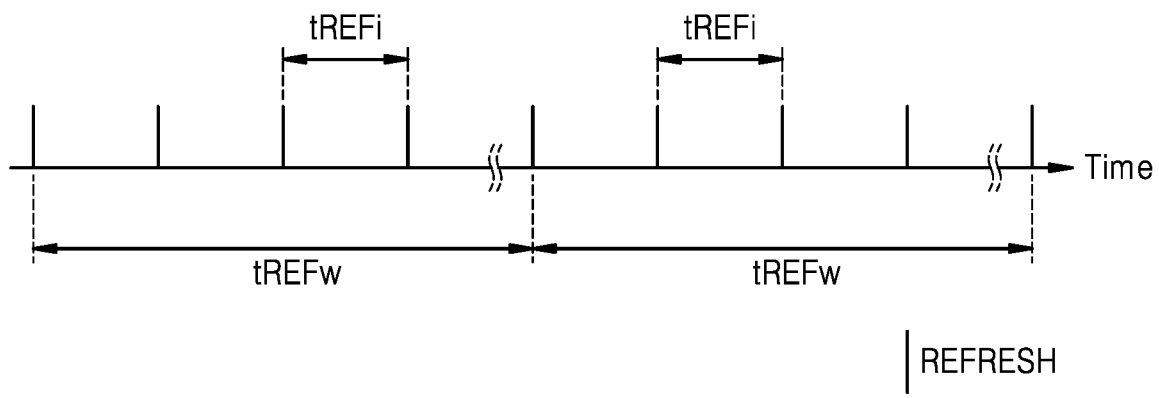
FIG. 4 is a diagram illustrating timing of a refresh operation according to embodiments of the present disclosure.

FIG. 4 is a diagram illustrating timing of a refresh operation according to an embodiment of the present disclosure. Referring to FIG. 4, a 32 millisecond or 64 millisecond refresh window time interval tREFw, which is defined in the JEDEC standard, may be set. Depending on the embodiment, the monitoring period according to embodiments of the present disclosure may correspond to the refresh rate time interval tREFi. The refresh rate time interval tREFi may be, for example, the number of refresh commands REFRESH of about 8K within a 32 millisecond refresh window time interval tREFw or a time interval corresponding to the number. However, the inventive concept is not limited thereto, and may include any other refresh rate at which the memory device 120 capable of operating.

Figure 5A:
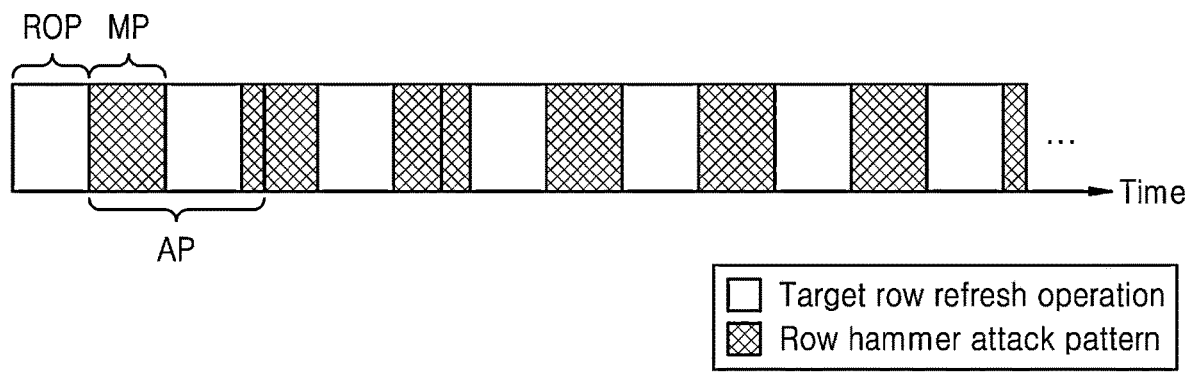
FIGS. 5A, 5B, and 5C are diagrams for explaining a refresh operation period and a monitoring period according to embodiments of the present disclosure.
Figure 5B:
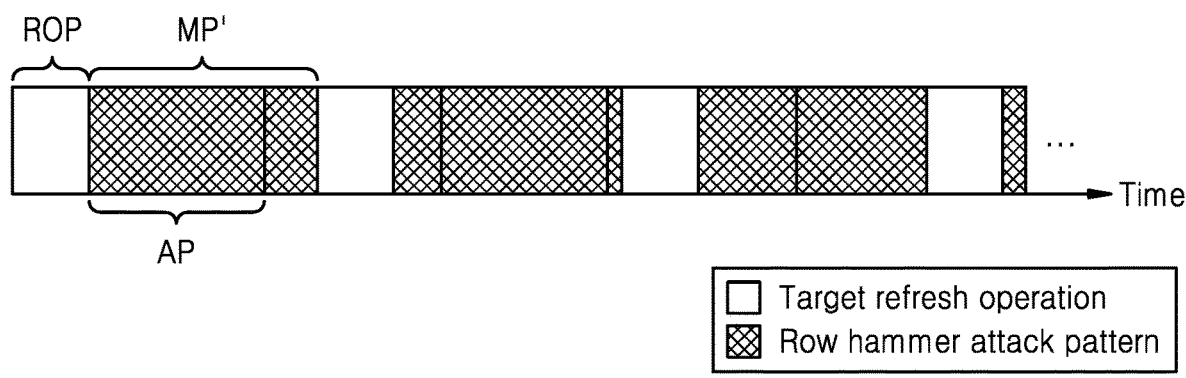
Figure 5C:
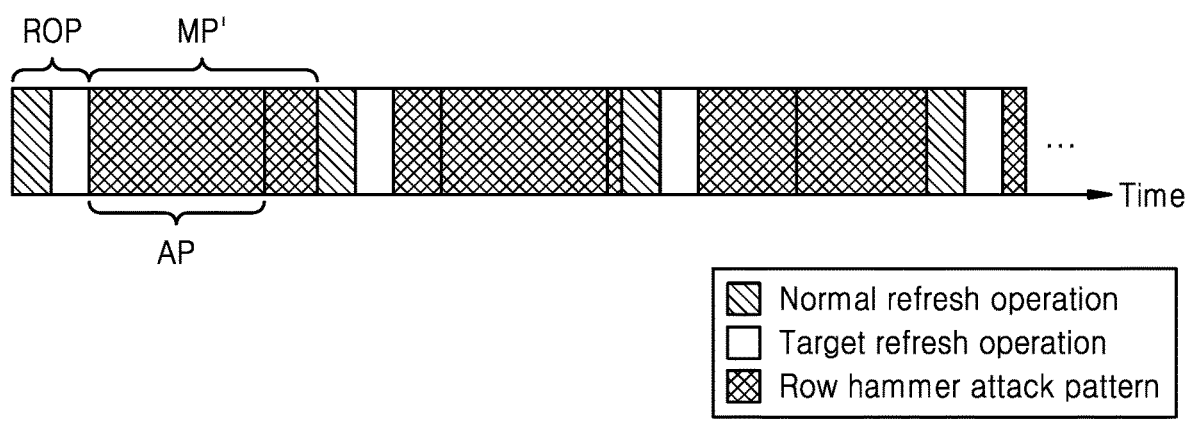

FIGS. 5A, 5B, and 5C are diagrams for explaining a refresh operation period and a monitoring period according to embodiments of the present disclosure. Referring to FIGS. 1, 3, and 5A, the memory controller 111 may periodically output a refresh command REF CMD using known algorithms and timing schedules, for example. Accordingly, the refresh operation period ROP and the monitoring period MP may occur sequentially. During the refresh operation period ROP, the memory device 120 may perform a refresh operation. As shown in FIG. 5A, the refresh operation may be a target row refresh operation.

Row hammer attack patterns may exist in various forms. For example, a row hammer attack pattern may include National Cyber Security Center (NCSC), A4, Google type 1, Uniform random, Blacksmith, and the like. However, the inventive concept is not limited thereto, and may include other row hammer attack patterns capable of hammering one or more rows of a memory cell array. As described above, since there are various row hammer attack patterns, the pattern size AP of the row hammer attack pattern may also be different for each pattern. The pattern size AP of the row hammer attack pattern may correspond to a period during which all of the memory cell rows to be attacked among a plurality of memory cell rows are completely attacked. Since the row hammer managing circuit 122 may count access corresponding to the memory cell row to be attacked, the pattern size AP of the row hammer attack pattern may correspond to a period during which all of a plurality of accesses thereto are counted. The pattern size AP of the row hammer attack pattern may be referred to as pattern length, pattern size, pattern operation time, and the like. However, as shown in FIG. 5A, if the monitoring period MP is less than the pattern size AP of the row hammer attack pattern, in the row hammer attack pattern, there is a case where all memory cell rows to be attacked cannot be monitored.

Referring to FIG. 5B, in some embodiments, the monitoring period MP' may be larger than the pattern size AP of the row hammer attack pattern. In one embodiment, the monitoring period MP' may be greater than or equal to a period during which all of the plurality of accesses thereto are counted. In another embodiment, the monitoring period MP' may be defined as the number of active commands that are greater than or equal to 1K or a period corresponding to the number. However, the inventive concept is not limited thereto. In some embodiments, the memory device 120 may perform a target row refresh operation during the refresh operation period ROP.

Referring to FIG. 5C, in some embodiments, the monitoring period MP' is greater than the pattern size AP of the row hammer attack pattern, and in the refresh operation period ROP, the memory device 120 may perform a normal refresh operation and a target row refresh operation. In one embodiment, a normal refresh operation and a target row refresh operation may be sequentially performed, and for example, a target row refresh operation may be performed after a normal refresh operation is performed. As described above, by setting the monitoring period MP' of the memory device 120 to be greater than the pattern size AP of the row hammer attack pattern, the performance and reliability of a memory device that controls row hammer for various row hammer attack patterns may be improved.

Figure 6:
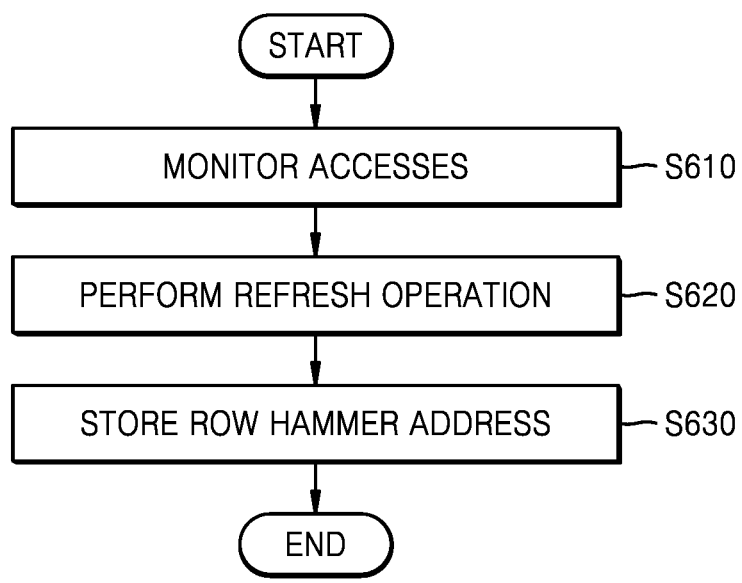
FIG. 6 is a flowchart illustrating a method of operating a memory device, according to example embodiments of the present disclosure.

FIG. 6 is a flowchart illustrating a method of operating a memory device, according to an embodiment of the present disclosure. Referring to FIGS. 3 and 6, a method of operating the memory device 120 of the present disclosure may include monitoring accesses in S610, performing a refresh operation in S620, and storing row hammer addresses in S630. The monitoring of the accesses in S610 is an operation in which the memory device 120 searches for a row hammer address RH_ADD based on the plurality of input row addresses ROW_ADD and the pre row hammer address Rpre stored in the first register 320. A plurality of input row addresses ROW_ADD may be included in a plurality of accesses by the host device 110. In one embodiment, in the monitoring of the accesses in S610, an input row address greater than the pre row hammer address Rpre among the plurality of input row addresses ROW_ADD, or a first minimum input row address among a plurality of input row addresses ROW_ADD may be stored in the second register 340 as a row hammer address RH_ADD.

The performing of the refresh operation in S620 is an operation in which the memory device 120 performs a refresh operation on a memory cell row that is physically adjacent to the memory cell row corresponding to the row hammer address RH_ADD in response to the refresh command REF CMD provided from the host device 110. The storing of the row hammer address in S630 is an operation in which the memory device 120 stores the row hammer address RH_ADD in the first register 320 as the pre row hammer address Rpre in response to the refresh command REF CMD. Specifically, for example, the register control circuit 310 may control the second register 340 to provide the row address Rfind stored in the second register 340 to the first register 320 in response to the refresh command REF CMD. Also, the flag generating circuit 360 may output a flag signal FLAG having the first bit value as an initial value. According to the method described above, by controlling various types of row hammers while reducing the number of registers for storing row hammer addresses, there is an effect of improving the degree of integration of a memory device. In addition, according to the above method, by controlling various types of row hammers, the performance and reliability of the memory device may be improved.

Figure 7:
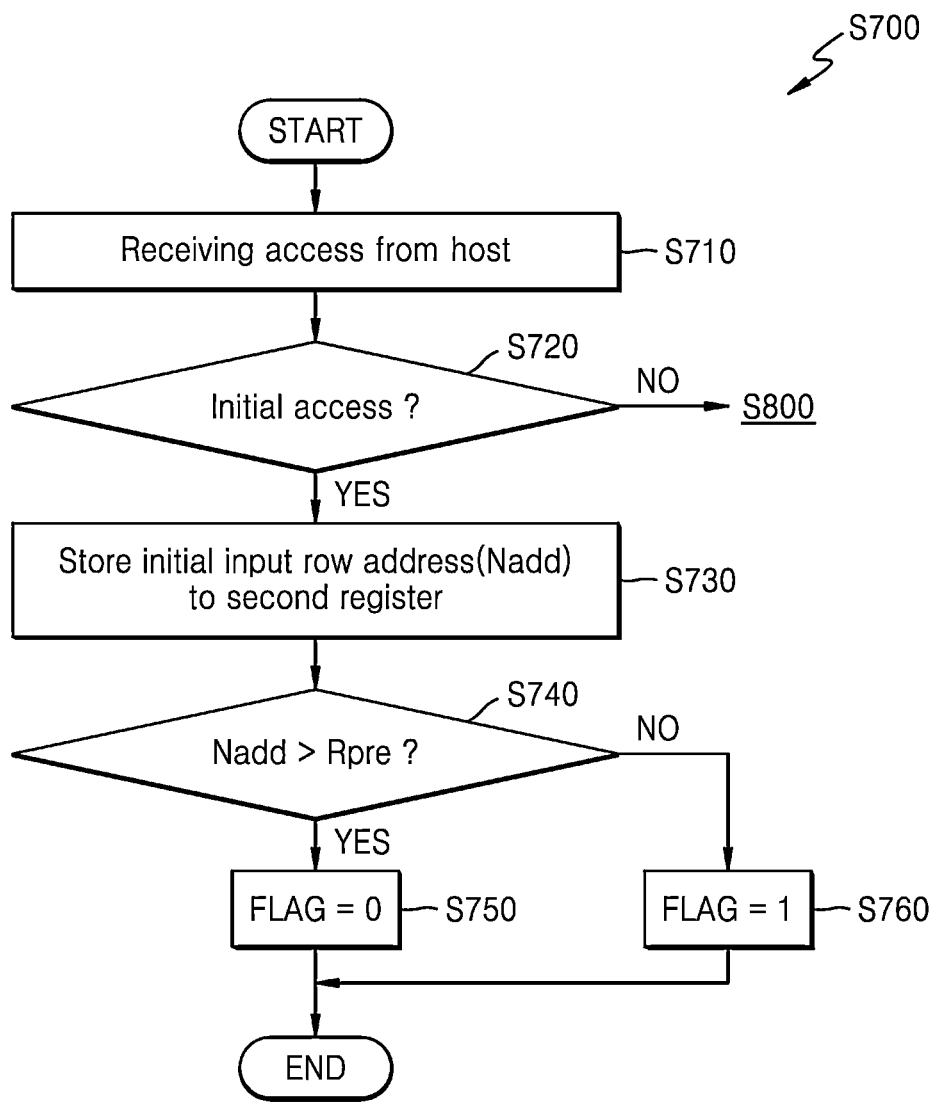
FIG. 7 is a flowchart for explaining embodiments of the step of monitoring accesses shown in FIG. 6.

FIG. 7 is a flowchart for explaining embodiments of the operation of monitoring accesses shown in FIG. 6. Referring to FIGS. 3, 6, and 7, the monitoring of the accesses shown in FIG. 6 in S610 will be referred to as storing the row hammer address RH_ADD in the second register 340 in S700. In S710, the host (e.g., the host device 110) transfers access to the memory device 120. In S720, a check is performed as to whether the received access is an initial access. The initial access may include an initial input row address Nadd. If the received access is initial access (S720, Yes), the initial input row address Nadd is stored in the second register 340 in S730. In particular, for example, the register control circuit 310 provides the initial input row address Nadd to the second register 340 to store the initial input row address Nadd in the second register 340. In S740, the initial input row address Nadd is compared to the pre row hammer address Rpre. Specifically, for example, it may be determined whether the initial input row address Nadd is greater than the pre row hammer address Rpre by the first comparator 330.

In one embodiment, one mode of the first mode and the second mode is executed according to a comparison result between the initial input row address Nadd and the pre row hammer address Rpre. The first mode may be a mode for detecting a first minimum input row address among the plurality of input row addresses ROW_ADD. The second mode may be a mode for detecting a second minimum input row address among the plurality of input row addresses ROW_ADD greater than the pre row hammer address Rpre. In particular, if the initial input row address Nadd is greater than the pre row hammer address Rpre (S740, Yes), in S750, the bit value of the flag signal FLAG may be set to "0" (or the first bit value). However, if the initial input row address Nadd is less than or equal to the pre row hammer address Rpre (S740, No), in S760, the bit value of the flag signal FLAG may be set to "1" (or the second bit value). And, if the received access is not initial access (S720, No), S800 is performed. S800 will be described later with reference to FIG. 8.

Figure 8:
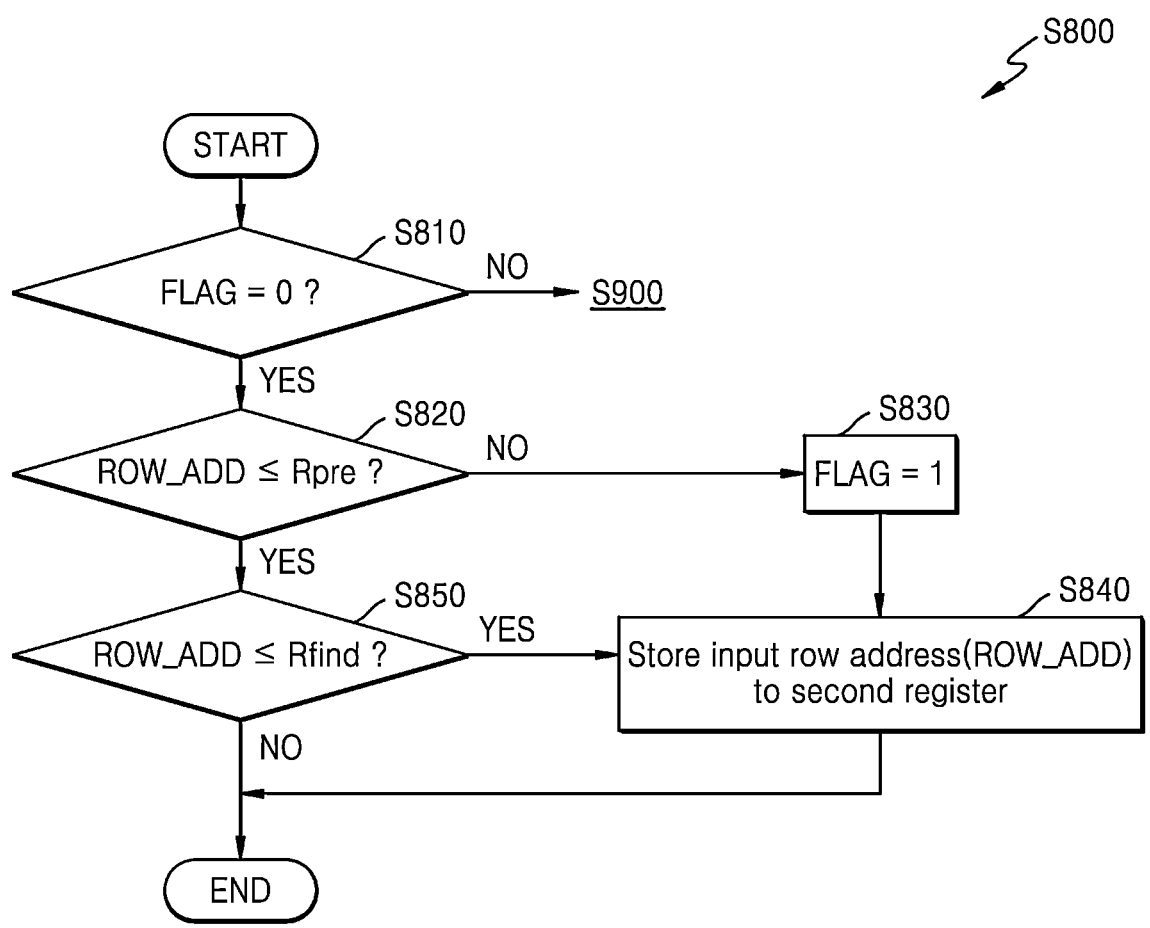
FIG. 8 is a flowchart illustrating another embodiment of the step of monitoring accesses shown in FIG. 6.

FIG. 8 is a flowchart illustrating another embodiment of the operation of monitoring accesses shown in FIG. 6. Referring to FIGS. 3, 6, and 8, in S810, it is checked whether the bit value of the flag is the first bit value. Specifically, for example, the register control circuit 310 may check the bit value of the flag.

If the bit value of the flag is the first bit value (S810, Yes), the first mode is executed in operation S820. In addition, during the first mode, it is further checked whether the input row address ROW_ADD input after the initial input row address Nadd is equal to or less than the pre row hammer address Rpre. Specifically, for example, the first comparator 330 may compare the input row address ROW_ADD to the pre row hammer address Rpre. If the input row address ROW_ADD is greater than the pre row hammer address Rpre (S820, No), in S830, for example, the flag generating circuit 360 changes the bit value of the flag signal FLAG from the first bit value to the second bit value, and the second mode is executed.

In S840, the register control circuit 310 stores the input row address ROW_ADD in the second register 340. If the input row address ROW_ADD is less than or equal to the pre row hammer address Rpre (S820, Yes), in S850, it is checked whether the input row address ROW_ADD is less than or equal to the row address Rfind stored in the second register 340.

If the input row address ROW_ADD is less than or equal to the row address Rfind (S850, Yes), S840 is performed. In this case, the first mode is continuously executed by the flag generating circuit 360 maintaining the bit value of the flag signal as the first bit value. If the bit value of the flag is the second bit value (S810, No), S900 is performed. S900 will be described later with reference to FIG. 9.

Figure 9:
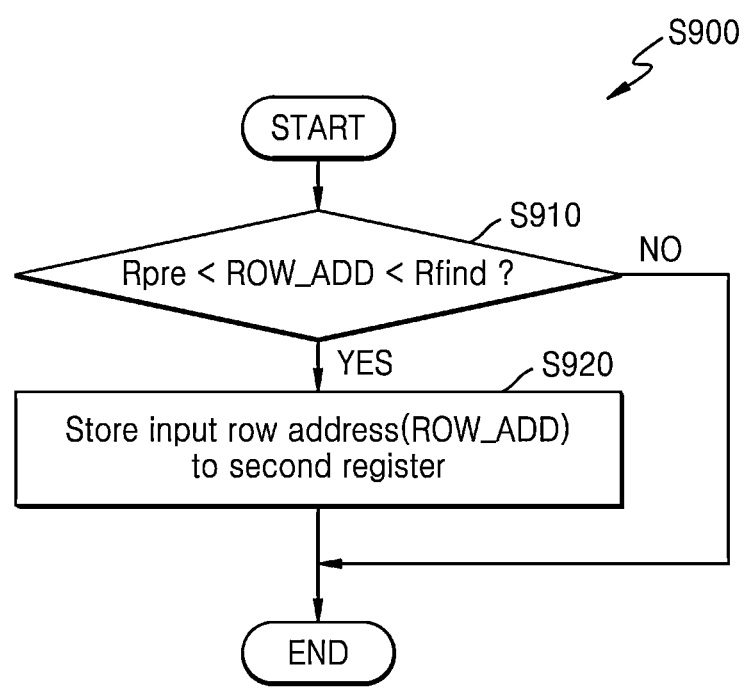
FIG. 9 is a flowchart illustrating another embodiment of the step of monitoring accesses shown in FIG. 6.

FIG. 9 is a flowchart illustrating another embodiment of the operation of monitoring accesses shown in FIG. 6. Referring to FIGS. 3, 6, and 9, S900 is an operation in which the second mode is executed. In S910, it is checked whether the input row address ROW_ADD input after the initial input row address Nadd is greater than the pre row hammer address Rpre and less than the row address Rfind stored in the second register 340.

If the input row address ROW_ADD is larger than the pre row hammer address Rpre and less than the row address Rfind (S910, Yes), in S920, the register control circuit 310 stores the input row address ROW_ADD in the second register 340. In this case, the flag generating circuit 360 may maintain the bit value of the flag as the second bit value.

Figure 10:
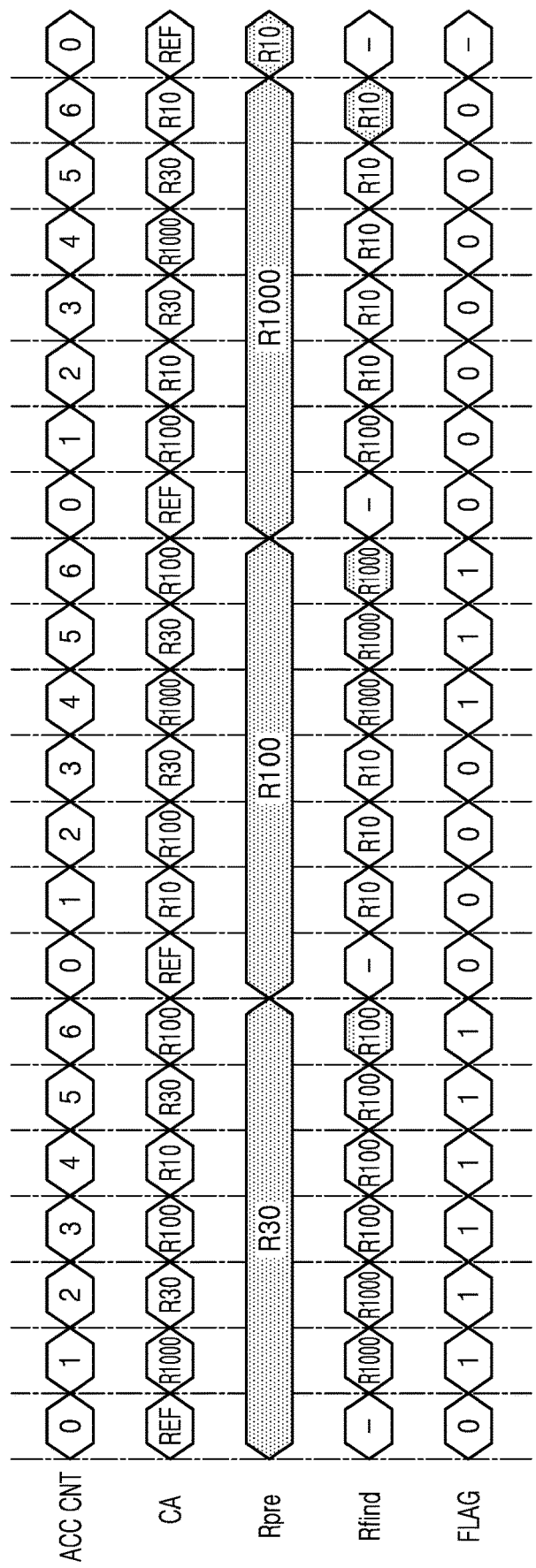
FIG. 10 is a diagram for explaining timing of an operation of managing row hammers according to embodiments of the present disclosure.

FIG. 10 is a diagram for explaining timing of an operation of managing row hammers according to embodiments of the present disclosure. Referring to FIGS. 3 and 10, it is assumed that the row hammer attack pattern is a pattern in which a row hammer attack is performed one or more times on memory cell rows having row address 10 R10, row address 30 R30, row address 100 R100, and row address 1000 R1000, respectively. The refresh operation period may correspond to the type of row address subject to row hammer attack. For example, in the row hammer attack pattern shown in FIG. 10, since there are four types of row addresses subjected to row hammer attacks, the refresh operation period shown in FIG. 10 may be four. A command REF may be input for each period of a refresh operation. The total number of access times within the period of the refresh operation may correspond to the product of the type of row address subject to row hammer attack and the period. For example, within a period corresponding to the time interval between one command REF and another command REF, since the number of access counts ACC CNT is "6", the total number of access times within the period of the refresh operation may be "24 (=6*4)". However, the inventive concept is not limited thereto. The command REF may be the refresh command REF CMD described above with reference to FIG. 3.

Referring to FIG. 10, for example, the monitoring period may be a corresponding period from when the command REF is input until the next command REF is input. It is assumed that the initial value of the pre row hammer address Rpre is row address 30 R30.

The access count ACC CNT may be increased by +1 whenever each of the row addresses R10, R30, R100, and R1000 is input to the row hammer managing circuit 300. The access count ACC CNT may be initialized to an initial value in response to input of the command REF. Referring to FIG. 10, for example, the access count ACC CNT may be initialized to "0" when the refresh command REF CMD is input to the row hammer managing circuit 300. When the command REF is input, the flag signal FLAG may be a first bit value (e.g., "0").

Referring to the first monitoring period shown in FIG. 10, in the first monitoring period, the row address 1000 R1000, the row address 30 R30, the row address 100 R100, the row address 10 R10, the row address 30 R30, and the row address 100 R100 may be sequentially input. In some embodiments, the row hammer managing circuit 300 may temporarily store the initial input row address input as initial in the monitoring period as a candidate for the row hammer address.

Referring still to FIG. 10, during the first monitoring period, the initial input row address is row address 1000 R1000. The register control circuit 310 stores the row address 1000 R1000 in the second register 340. The row address 1000 R1000 is stored in the second register 340 as a row hammer address candidate (e.g., the row address Rfind shown in FIG. 10).

In some embodiments, the row hammer managing circuit 300 may execute one of the first mode and the second mode based on the initial input row address and the pre row hammer address. Referring to FIG. 10, for example, since the row address 1000 R1000 is greater than the row address 30 R30, the bit value of the flag signal FLAG is the second bit value (e.g., "1"). As the flag signal FLAG has the second bit value, the second mode may be executed.

In some embodiments, if an input row address input after the initial input row address in the second mode is greater than a pre row hammer address and the input row address is less than a row address temporarily stored as a row hammer address candidate, the row hammer managing circuit 300 may temporarily store the input row address as a row hammer address candidate. However, according to an embodiment, if the input row address in the second mode is greater than the pre row hammer address Rpre and less than the row address Rfind already stored in the second register 340, an input row address may be stored in the second register 340.

Referring still to FIG. 10, for example, row address 30 R30 input next to row address 1000 R1000 is the same as the pre row hammer address Rpre. Therefore, the row address 30 R30 is not stored in the second register 340. The row address 100 R100 input next to the row address 30 R30 is greater than the row address 30 R30, which is the pre row hammer address Rpre. Also, the row address 100 R100 is less than the row address 1000 R1000, which is the row address Rfind previously stored in the second register 340. Accordingly, the row address 100 R100 is stored in the second register 340. In this way, the row address 10 R10, the row address 30 R30, and the row address 100 R100 are sequentially input, and according to the size condition in the second mode described above, the row address Rfind stored in the second register 340 is the row address 100 R100.

In some embodiments, the row hammer managing circuit 300 may output a row address temporarily stored as a row hammer address candidate as a row hammer address in the monitoring period in the second mode in response to the refresh command REF CMD. As indicated in the row address Rfind in the first monitoring period shown in FIG. 10, in the first monitoring period, row address 100 R100 is detected as a row hammer address RH_ADD next to row address 30 R30. Also, the row address 100 R100 may be output in response to the command REF.

In some embodiments, the row hammer managing circuit 300 may detect, as a row hammer address RH_ADD, a first input row address greater than a pre row hammer address Rpre among a plurality of input row addresses in a first monitoring period, and store the detected first input row address in the second register 340. In one embodiment, the first input row address (or first row address) may be the smallest row address greater than the pre row hammer address Rpre among input row addresses (or row addresses) input during the first monitoring period. Referring to FIG. 10, for example, among row addresses 10 R10, row addresses 30 R30, row addresses 100 R100, and row addresses 1000 R1000 input during the first monitoring period, row addresses greater than the row address 30 R30, which is the pre row hammer address Rpre, are the row address 100 R100 and the row address 1000 R1000. Since the smallest row address among the row address 100 R100 and the row address 1000 R1000 is the row address 100 R100, the first input row address (or first row address) is the row address 100 R100.

In some embodiments, during a refresh operation after the first monitoring period, the row hammer managing circuit 300 may store the first input row address (or first row address) in the first register 320 as a pre row hammer address Rpre. Referring to FIG. 10, for example, if the command REF is input after the first monitoring period, the row address 100 R100, which is the row address Rfind detected in the first monitoring period, is stored in the first register 320 as the pre row hammer address Rpre.

Referring to the second monitoring period after the first monitoring period shown in FIG. 10, in the second monitoring period, the row address 10 R10, the row address 100 R100, the row address 30 R30, the row address 1000 R1000, the row address 30 R30, and the row address 100 R100 may be sequentially input. In some embodiments, the row hammer managing circuit 300 may store the first input row address (or first row address) as the pre row hammer address Rpre in the second monitoring period. For example, referring to FIG. 10, since the first input row address (or first row address) is row address 100 R100, the row address 100 R100 is stored in the first register 320 as a pre row hammer address Rpre in the second monitoring period. When the command REF is input, the flag signal FLAG may be a first bit value (e.g., "0"). Row address 10 R10, which is an initial input row address, is stored in the second register 340 (e.g., the row address Rfind).

In some embodiments, the row hammer managing circuit 300 may execute the first mode when the initial input row address is less than or equal to the pre row hammer address Rpre. Referring to FIG. 10, for example, since the row address 10 R10 is less than the row address 100 R100, the flag signal FLAG maintains the first bit value, so that the first mode is executed. Then, since row addresses 100 R100 and row addresses 30 R30 are each greater than row address 10 R10 stored as a candidate (e.g., the row address Rfind) for the row hammer address RH_ADD in the first mode, the bit value of the flag signal FLAG is still the first bit value.

In some embodiments, in the first mode, if the input row address input after the initial input row address is greater than the pre row hammer address Rpre, the row hammer managing circuit 300 may temporarily store the input row address as a row hammer address RH_ADD candidate and execute the second mode. Referring to FIG. 10, for example, since row address 1000 R1000 input after row address 30 R30 is greater than row address 100 R100, the row address 1000 R1000 is stored in the second register 340. Also, the bit value of the flag signal FLAG is changed from the first bit value to the second bit value (e.g., "1"). In the second mode, since the row address 30 R30 input after the row address 1000 R1000 is less than the pre row hammer address Rpre, and the row address 100 R100 input after the row address 30 R30 is the same as the pre row hammer address Rpre, the row address Rfind stored in the second register 340 is maintained as the row address 1000 R1000.

In some embodiments, in the second monitoring period, the row hammer managing circuit 300 may detect a second input row address (or second row address) greater than the first input row address (or first row address) as a row hammer address RH_ADD, and store the second input row address (or second row address) in the second register 340. In an embodiment, the second input row address (or second row address) may be a next smallest row address after the first input row address (or first row address) among the row addresses input during the second monitoring period. Referring to FIG. 10, for example, the first input row address (or first row address) is the row address 100 R100. Among row addresses 10 R10, row addresses 30 R30, row addresses 100 R100, and row addresses 1000 R1000 input during the second monitoring period, a row address greater than the row address 100 R100 is row address 1000 R1000. Accordingly, the second input row address (or second row address) is row address 1000 R1000.

In some embodiments, during a refresh operation after the second monitoring period, the row hammer managing circuit 300 may store the second input row address (or second row address) in the first register 320 as a pre row hammer address Rpre. Referring to FIG. 10, a row address 1000 R1000 is stored in the first register 320 as a pre row hammer address Rpre. When the command REF is input, the flag signal FLAG may be a first bit value (e.g., "0").

In some embodiments, in the third monitoring period after the second monitoring period shown in FIG. 10, row address 100 R100, which is an initial input row address, is stored in the second register 340 (e.g., row address Rfind).

In some embodiments, in the first mode, if the input row address input after the initial input row address is less than or equal to the pre row hammer address and the input row address is less than or equal to the row address temporarily stored as a row hammer address candidate, the row hammer managing circuit 300 may temporarily store the input row address as a row hammer address candidate. For example, referring to FIG. 10, since row address 10 R10 input after row address 100 R100 is less than row address 1000 R1000 and less than row address 100 R100, row address 10 R10 is stored in the second register 340. At this time, the flag signal FLAG is maintained at the first bit value. Row addresses R30, R1000, R30, and R10 input after row address 10 R10 in the first mode are less than or equal to row address 1000 R1000, which is a pre row hammer address Rpre. Also, the row addresses R30, R1000, R30, and R10 are greater than or equal to row address 10 R10, which is the row address Rfind stored in the second register 340. Accordingly, the row address 10 R10 is continuously stored in the second register 340.

In some embodiments, when a plurality of input row addresses are less than or equal to the pre row hammer address, the row hammer managing circuit 300 may detect a minimum input row address among a plurality of input row addresses as the row hammer address RH_ADD. Referring to FIG. 10, for example, in the third monitoring period, the plurality of input row addresses are row address 100 R100, row address 10 R10, row address 30 R30, row address 1000 R1000, row address 30 R30, and row address 10 R10. In the third monitoring period, since the pre row hammer address Rpre is the row address 1000 R1000, among the plurality of input row addresses, the smallest input row address is row address 10 R10, and row address 10 R10 is detected as the row hammer address RH_ADD. In response to the command REF input after the third monitoring period, the row address 10 R10 is output as the row hammer address RH_ADD.

According to the above-described embodiment, by controlling various types of row hammers while reducing the number of registers for storing row hammer addresses, there is an effect of improving the degree of integration of a memory device. In addition, according to the above embodiment, by controlling various types of row hammers, the performance and reliability of the memory device may be improved.

Figure 11:
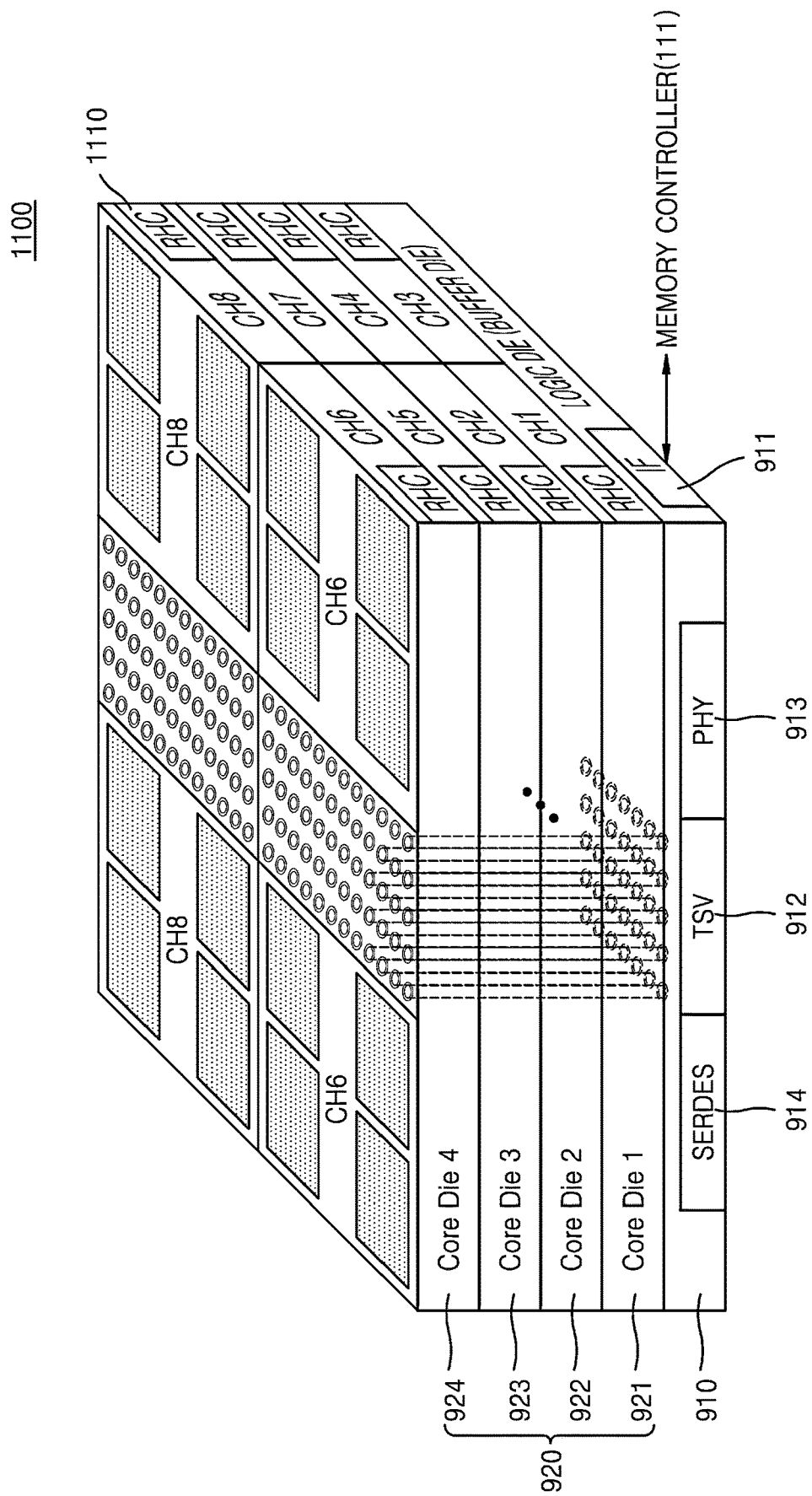
FIG. 11 is a diagram for explaining a memory device implemented as a high bandwidth memory (HBM) according to an embodiment of the present disclosure.

FIG. 11 is a diagram for explaining a memory device implemented as a high bandwidth memory (HBM) according to an embodiment of the present disclosure. Referring now to FIG. 11, the HBM configuration shown in FIG. 11 may be provided as an example and is not limited to that shown in FIG. 11. The memory device 1100 shown in FIG. 11 may be referred to as HBM. The memory device 1100 may be connected to a host (e.g., the host device 110 shown in FIG. 1) through the HBM protocol of the JEDEC standard. The HBM protocol may be a high-performance random access memory interface for three-dimensional stacked memories (e.g., DRAM). The memory device 1100 generally achieves a wider bandwidth, while consuming less power, in a substantially less form factor than other DRAM technologies (e.g., DDR4, GDDR5, etc.).

The memory device 1100 may have a high bandwidth by including a plurality of channels CH1 to CH8 having interfaces independent of each other. The memory device 1100 may include a plurality of dies 910 and 920. For example, the memory device 1110 may include a logic die (or buffer die) 910 and one or more core dies 920. One or more core dies 920 may be stacked over the logic die 910. In FIG. 11, the first to fourth core dies 921 to 924 may be included in the memory device 1100, but the number of one or more core dies 920 may be variously changed. One or more core dies 920 may be referred to as memory dies.

Each of the first to fourth core dies 921 to 924 may include one or more channels. For example, each of the first to fourth core dies 921 to 924 may include two channels, and the memory device 1100 may include eight channels CH1 to CH8. Specifically, for example, the first core die 921 may include a first channel CH1 and a third channel CH3, the second core die 922 may include a second channel CH2 and a fourth channel CH4, the third core die 923 may include a fifth channel CH5 and a seventh channel CH7, and the fourth core die 924 may include a sixth channel CH6 and an eighth channel CH8.

The logic die 910 may include an interface circuit 911 that communicates with the memory controller 111. The logic die 910 may receive commands/addresses and data from the memory controller 111 through the interface circuit 911. The interface circuit 911 is a channel through which the memory controller 111 requests a memory operation or calculation process, and may transfer a command/address and data. Each of the core dies 920 or each of the channels CH1 to CH8 may include a processor-in-memory (PIM) circuit.

Each of the channels CH1 to CH8 may include a plurality of banks, and one or more processing elements may be provided in a PIM circuit of each channel. As an example, the number of processing elements in each channel may be equal to the number of banks. As the number of processing elements is less than the number of banks, one processing element may be shared by at least two banks. The PIM circuit of each channel may execute a kernel offloaded by the memory controller 111.

Each of the channels CH1 to CH8 may include the row hammer managing circuit (RHC) described above with reference to FIGS. 1 to 10. Each of the channels CH1 to CH8 may further include a memory cell array and a refresh control circuit. The logic die 910 may further include a through silicon via (TSV) region 912, an HBM physical layer interface (HBM PHY) region 913, and a serializer/deserializer (SERDES) region 914. The TSV region 912 is a region in which a TSV for communication with the core dies 920 is formed, and is a region in which the bus(es) 130 disposed corresponding to the channel(s) CH1 to CH8 are formed. When each channel CH1 to CH8 has a bandwidth of 128 bits, the TSVs may include configurations for data I/O of 1024 bits.

The HBM PHY region 913 may include a plurality of I/O circuits for communication with the memory controller 111 and the channels CH1 to CH8, and for example, the HBM PHY region 913 may include one or more interconnect circuits for connecting the memory controller 111 to the channels CH1 to CH8. The HBM PHY region 913 may include physical or electrical layers and logical layers provided for signals, frequency, timing, driving, detailed operating parameters and functionality required for efficient communication between the memory controller 111 and the channels CH1 to CH8. The HBM PHY region 913 may perform memory interfacing such as selecting a row and column corresponding to a memory cell for a corresponding channel, writing data to the memory cell, or reading the written data. The HBM PHY region 913 may support features of the HBM protocol of the JEDEC standard.

As the processing throughput of the processor(s) of the memory controller 111 increases, and as demands for memory bandwidth increase, the SERDES area 914 is a region that provides a SERDES interface of the JEDEC standard. The SERDES region 914 may include a SERDES transmitter portion, a SERDES receiver portion, and a controller portion. The SERDES transmitter portion includes a parallel-to-serial circuit and a transmitter, and is capable of receiving a parallel data stream and serializing the received parallel data stream. The SERDES receiver portion includes a receiver amplifier, an equalizer, a clock and data recovery circuit, and a serial-to-parallel circuit, and may receive the serial data stream and parallelize the received serial data stream. The controller portion may include an error detection circuit, an error correction circuit, and a register such as First In First Out (FIFO).

The memory controller 111 may transmit commands/addresses and data through the bus(es) 130 disposed corresponding to the channel(s) CH1 to CH8. In some embodiments, the bus 130 may be formed to be divided for each channel, or a part of the bus 130 may be shared by at least two channels. The memory controller 111 may provide commands/addresses and data so that at least some of the plurality of computational tasks or kernels are executed in the memory device 1100. Operation processing may be performed in the PIM circuit of the channel designated by the memory controller 111. In one example, if the received command/address indicates an arithmetic process, the PIM circuit of the corresponding channel may perform operation processing using write data provided from the memory controller 111 and/or read data provided from the corresponding channel. In one example, when a command/address received through a corresponding channel of the memory device 1100 indicates a memory operation, a data access operation may be performed.

Figure 12:
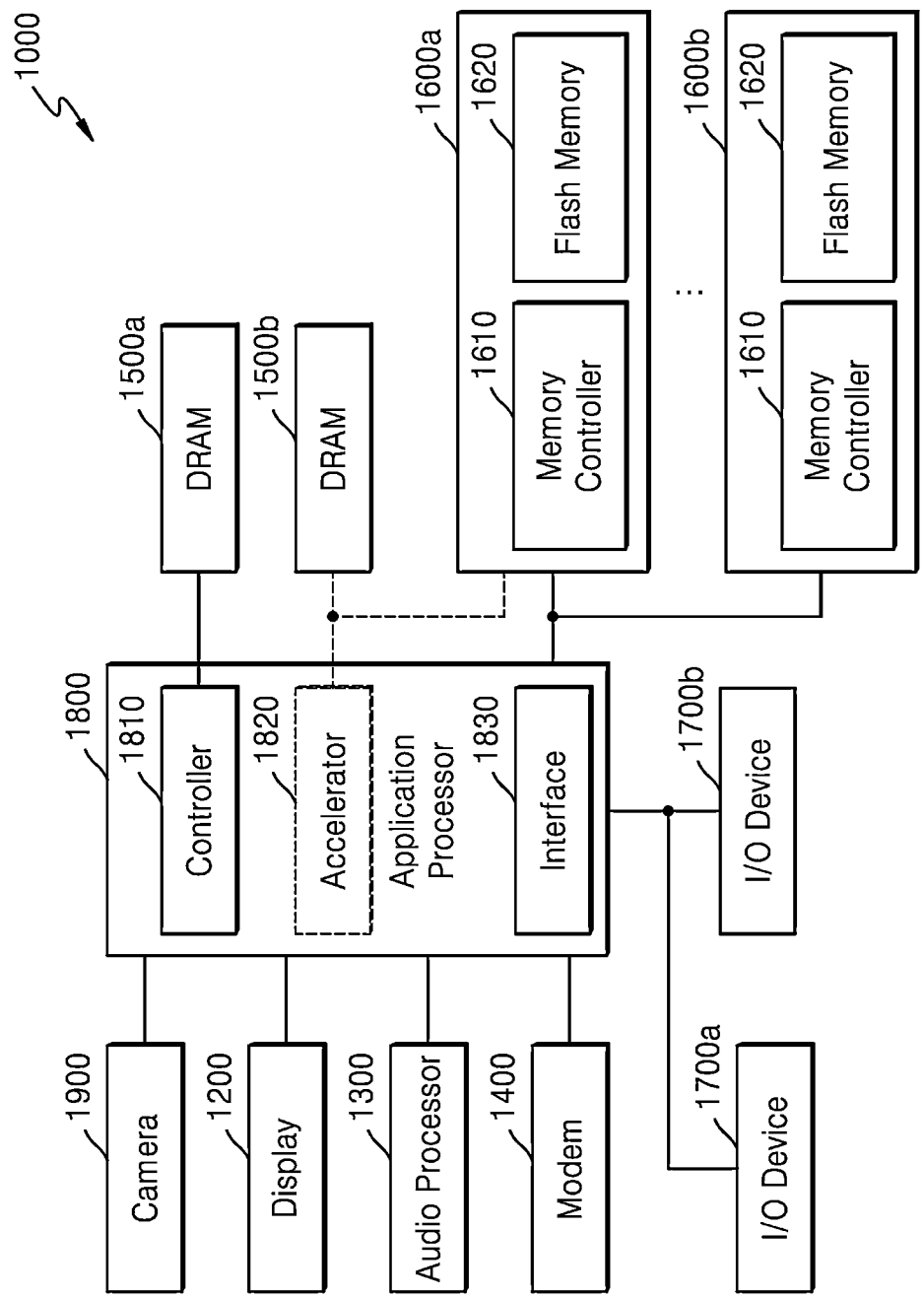
FIG. 12 is a diagram for explaining a system according to embodiments of the present disclosure.

FIG. 12 is a diagram for explaining a system according to embodiments of the present disclosure. Referring to FIG. 12, the system 1000 may include a camera 1900, a display 1200, an audio processor 1300, a modem 1400, DRAMs 1500*a* and 1500*b*, flash memories 1600*a* and 1600*b*, I/O devices 1700*a* and 1700*b*, and an AP 1800. The system 1000 may be implemented as a laptop computer, a mobile phone, a smart phone, a tablet personal computer, a wearable device, a healthcare device, or an Internet of Things (IoT) device. In addition, the system 1000 may be implemented as a server or a personal computer. The camera 1900 may take a still image or a moving picture according to a user's control, and may store the captured image/video data or transmit the stored captured image/video data to the display 1200. The audio processor 1300 may process audio data included in content of the flash memories 1600*a* and 1600*b* or a network. The modem 1400 modulates and transmits a signal to transmit/receive wired/wireless data, and may demodulate the modulated signal to restore the original signal at the receiving end. The I/O devices 1700*a* and 1700*b* may include devices that provide digital input and/or output functionality such as a Universal Serial Bus (USB) or storage, a digital camera, a Secure Digital (SD) card, a Digital Versatile Disc (DVD), a network adapter, a touch screen, and the like.

The AP 1800 may control the overall operation of the system 1000. The AP 1800 may control the display 1200 so that a part of the content stored in the flash memories 1600*a* and 1600*b* is displayed on the display 1200. When a user input is received through the I/O devices 1700*a* and 1700*b*, the AP 1800 may perform a control operation corresponding to the user input. The AP 1800 may include an accelerator block, which is a dedicated circuit for artificial intelligence (AI) data operation, or may include an accelerator chip 1820 separately from the AP 1800. A DRAM 1500*b* may be additionally mounted to the accelerator block or accelerator chip 1820. The accelerator chip 1820 is a function block that professionally performs a certain function of the AP 1800, and may include a GPU that is a function block that specializes in processing graphic data, a Neural Processing Unit (NPU) that is a block for professionally performing AI calculations and inference, and a Data Processing Unit (DPU) that is a block for specializing in data transfer.

The system 1000 may include the plurality of DRAMs 1500*a* and 1500*b*. The AP 1800 may control the DRAMs 1500*a* and 1500*b* through the command and mode register set (MRS) that meets the JEDEC standard, and communicate by setting the DRAM interface protocol to use company-specific functions such as low voltage/high speed/reliability and Cyclic Redundancy Check (CRC)/Error Correction Code (ECC) functions. For example, the AP 1800 may communicate with the DRAM 1500*a* through an interface conforming to JEDEC standards such as LPDDR4 and LPDDR5. and the accelerator block or accelerator chip 1820 may communicate by setting a new DRAM interface protocol to control the accelerator DRAM 1500*b* having a higher bandwidth than the DRAM 1500*a*.

Although only the DRAMs 1500*a* and 1500*b* are illustrated in FIG. 12, the inventive concept is not limited thereto, and if bandwidth, reaction speed, and voltage conditions of the AP 1800 or accelerator chip 1820 are satisfied, any memory, such as PRAM, SRAM, MRAM, RRAM, FRAM, or Hybrid RAM, may be used. The DRAMs 1500*a* and 1500*b* have relatively less latency and bandwidth than the I/O devices 1700*a* and 1700*b* or the flash memories 1600*a* and 1600*b*. The DRAMs 1500*a* and 1500*b* may be initialized at the power-on time point of system 1000, and may be used as a temporary storage location for the operating system and application data loaded with the operating system and application data, or may be used as an execution space for various software codes.

In the DRAMs 1500*a* and 1500*b*, addition/subtraction/multiplication/division operations, vector operations, address operations, or Fast Fourier Transform (FFT) operations may be performed. In addition, a function used for inference may be performed in the DRAMs 1500*a* and 1500*b*. Here, the inference may be performed in a deep learning algorithm using an artificial neural network. The deep learning algorithm may include a training operation of learning a model through various data and an inference operation of recognizing data with the learned model. As an embodiment, the image captured by the user through the camera 1900 is signal-processed and stored in the DRAM 1500*b*, and the accelerator block or accelerator chip 1820 may perform AI data operation for recognizing data using data stored in the DRAM 1500*b* and a function used for inference.

The system 1000 may include a plurality of storage or a plurality of flash memories 1600*a* and 1600*b* having a larger capacity than the DRAMs 1500*a* and 1500*b*. The accelerator block or accelerator chip 1820 may perform a training operation and AI data operation by using the flash memories 1600*a* and 1600*b*. In an embodiment, the flash memories 1600*a* and 1600*b* may more efficiently perform a training operation and an inference AI data operation performed by the AP 1800 and/or the accelerator chip 1820 using the arithmetic device provided in the memory controller 1610. The flash memories 1600*a* and 1600*b* may store pictures taken through the camera 1900 or data transmitted through a data network. For example, augmented reality/virtual reality, High Definition (HD), or Ultra High Definition (UHD) content may be stored. The DRAMs 1500*a* and 1500*b* may include the row hammer managing circuit described with reference to FIGS. 1 to 10.

While the inventive concept has been particularly shown and described with reference to embodiments thereof, it will be understood that various changes in form and details may be made therein without departing from the spirit and scope of the following claims.

What is claimed is:
1. A memory device, comprising:
a memory cell array including a plurality of memory cell rows;
a row hammer managing circuit configured to:
detect an earlier row hammer address during an earlier monitoring period,
detect a row hammer address by comparing the earlier row hammer address to each of a plurality of input row addresses associated with a plurality of accesses during a monitoring period for monitoring the plurality of accesses to the plurality of memory cell rows, and output the row hammer address in response to a refresh command provided from a host; and a refresh control circuit configured to perform a refresh operation on a memory cell row physically adjacent to a memory cell row corresponding to the row hammer address; and wherein the earlier monitoring period precedes, in time, the monitoring period for monitoring the plurality of access to the plurality of memory cell rows.

2. The memory device of claim 1, wherein the row hammer managing circuit is further configured to:

detect, as the row hammer address, a first input row address greater than the earlier row hammer address among the plurality of input row addresses during a first monitoring period; and detect, as the row hammer address, a second input row address greater than the first input row address during a second monitoring period following the first monitoring period.

3. The memory device of claim 2, wherein the row hammer managing circuit is further configured to store the first input row address as an updated earlier row hammer address during the second monitoring period.

4. The memory device of claim 1, wherein the row hammer managing circuit is further configured to detect a minimum input row address among the plurality of input row addresses as the row hammer address when the plurality of input row addresses are less than or equal to the earlier row hammer address.

5. The memory device of claim 1, wherein the row hammer managing circuit is further configured to:

store an initial input row address input during the monitoring period as a candidate for the row hammer address; and execute one of a first mode for detecting a first minimum input row address among the plurality of input row addresses and a second mode for detecting a second minimum input row address among the plurality of input row addresses greater than the earlier row hammer address, based on the initial input row address and the earlier row hammer address.

6. The memory device of claim 5, wherein the row hammer managing circuit is further configured to:

execute the first mode when the initial input row address is less than or equal to the earlier row hammer address;

store the input row address as a row hammer address candidate when an input row address input after the initial input row address is greater than the earlier row hammer address in the first mode; and execute the second mode.

7. The memory device of claim 5, wherein the row hammer managing circuit is further configured to:

execute the first mode when the initial input row address is less than or equal to the earlier row hammer address; and store the input row address as a candidate for the row hammer address if an input row address input after the initial input row address is less than or equal to the earlier row hammer address and the input row address is less than or equal to a row address stored as a row hammer address candidate in the first mode.

8. The memory device of claim 5, wherein the row hammer managing circuit is further configured to store the input row address as a candidate for the row hammer address if an input row address input after the initial input row address is greater than the earlier row hammer address and the input row address is less than a row address stored as a row hammer address candidate, in the second mode.

9. The memory device of claim 8, wherein the row hammer managing circuit is further configured to output a row address stored as a candidate for the row hammer address as the row hammer address during the monitoring period, in response to the refresh command in the second mode.

10. The memory device of claim 1, wherein the monitoring period is greater than or equal to a period during which all of the plurality of accesses thereto are counted.

11. A method of operating a memory device, comprising:

detecting an earlier row hammer address during an earlier monitoring period;

storing in a second register during a monitoring period, an input row address greater than the earlier row hammer address among a plurality of input row addresses or a first minimum input row address among the plurality of input row addresses as a row hammer address, by comparing the plurality of input row addresses included in a plurality of accesses by a host to the earlier row hammer address, which is stored in a first register;

performing a refresh operation on a memory cell row physically adjacent to a memory cell row corresponding to the row hammer address, in response to a refresh command provided from the host; and storing a row hammer address as an updated earlier row hammer address in the first register in response to the refresh command; and wherein the earlier monitoring period precedes, in time, the monitoring period.

12. The method of claim 11, wherein the storing of the row hammer address in the second register comprises:

storing, in the second register, an initial input row address included in an initial access among the plurality of accesses;

comparing the initial input row address to the earlier row hammer address; and executing any one of a first mode for detecting the first minimum input row address and a second mode for detecting a second minimum input row address among input row addresses greater than the earlier row hammer address according to a comparison result between the initial input row address and the earlier row hammer address.

13. The method of claim 12, wherein the storing of the row hammer address in the second register comprises:

checking whether an input row address input after the initial input row address is less than or equal to the earlier row hammer address in the first mode;

storing the input row address in the second register when the input row address is greater than the earlier row hammer address; and executing the second mode.

14. The method of claim 13, wherein the storing of the row hammer address in the second register comprises:

checking whether the input row address is less than or equal to the row address stored in the second register when the input row address is less than or equal to the earlier row hammer address; and storing the input row address in the second register when the input row address is less than or equal to the row address.

15. The method of claim 12, wherein the storing of the row hammer address in the second register comprises:

checking whether an input row address input after the initial input row address is greater than the earlier row hammer address and less than a row address stored in the second register in the second mode; and storing the input row address in the second register when the input row address is greater than the earlier row hammer address and less than the row address.

16. A memory device, comprising:

a memory cell array including a plurality of memory cell rows;

a row hammer managing circuit configured to detect a row hammer address during a monitoring period for monitoring a plurality of accesses to the plurality of memory cell rows, and output the row hammer address in response to a refresh command provided from a host; and a refresh control circuit configured to output a target row address to perform a refresh operation on a memory cell row physically adjacent to a memory cell row corresponding to the row hammer address;

wherein the row hammer managing circuit comprises:

a first register configured to store an earlier row hammer address detected as the row hammer address in a monitoring period prior to the monitoring period;

a first comparator configured to output a first comparison result signal indicating a result of comparing an input row address provided from the host with the earlier row hammer address;

a second register configured to store the input row address;

a second comparator configured to output a second comparison result signal indicating a result of comparing the input row address with a row address stored in the second register;

a flag generating circuit configured to output a flag signal based on the first comparison result signal and the second comparison result signal; and a register control circuit configured to control the second register to output the row address stored in the second register as the row hammer address based on the refresh command, the first comparison result signal, the second comparison result signal, and the flag signal.

17. The memory device of claim 16, wherein the register control circuit provides an initial input row address input initially in the monitoring period to the second register so as to store the initial input row address in the second register; and wherein the flag signal has a first bit value when the initial input row address is less than or equal to the earlier row hammer address, and has a second bit value that is different from the first bit value when the initial input row address is greater than the earlier row hammer address.

18. The memory device of claim 17, wherein the register control circuit stores the input row address in the second register if the flag signal has the first bit value and an input row address input after the initial input row address is greater than the earlier row hammer address; and wherein the flag generating circuit changes the bit value of the flag signal from the first bit value to the second bit value.

19. The memory device of claim 17, wherein the register control circuit stores the input row address in the second register if the flag signal has the first bit value, an input row address input after the initial input row address is less than or equal to the earlier row hammer address, and the input row address is less than or equal to the row address; and wherein the flag generating circuit maintains a bit value of the flag signal as the first bit value.

20. The memory device of claim 17, wherein the register control circuit stores the input row address in the second register if the flag signal has the second bit value and an input row address input after the initial input row address is greater than the earlier row hammer address and less than the row address; and wherein the flag generating circuit maintains a bit value of the flag signal as the second bit value.

* * * * *